US012763775B2

(12) United States Patent
Lim et al.

(10) Patent No.: US 12,763,775 B2
(45) Date of Patent: Oct. 13, 2026

(54) LEVEL SHIFTER INCLUDING CAPACITOR AND METHOD OF OPERATING THE SAME

(71) Applicant: SAMSUNG ELECTRONICS CO., LTD., Suwon-si (KR)

(72) Inventors: Cheolhwan Lim, Suwon-si (KR); Sangho Kim, Suwon-si (KR); Soomin Lee, Suwon-si (KR); Joosung Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 43 days.

(21) Appl. No.: 18/895,535

(22) Filed: Sep. 25, 2024

(65) Prior Publication Data

US 2025/0233592 A1 Jul. 17, 2025

(30) Foreign Application Priority Data

Jan. 16, 2024 (KR) ........................ 10-2024-0006742

(51) Int. Cl.
*H03K 19/0185* (2006.01)
*H03K 19/00* (2006.01)

(52) U.S. Cl.
CPC . *H03K 19/018521* (2013.01); *H03K 19/0013* (2013.01)

(58) Field of Classification Search
None
See application file for complete search history.

(56) References Cited

U.S. PATENT DOCUMENTS 6,043,699 A * 3/2000 Shimizu ........... H03K 3/356113 327/437
6,980,194 B2 * 12/2005 Tobita ............ H03K 19/018507 327/333
7,176,740 B2 2/2007 Tachibana et al.
7,449,933 B2 * 11/2008 Goncalves ....... H03K 3/356113 327/333
7,675,343 B2 * 3/2010 Kwon .................... G09G 5/006 345/212
7,839,197 B2 11/2010 Chen et al.
8,643,426 B2 2/2014 Zhang et al.
8,669,803 B2 3/2014 Huang et al.

(Continued)

OTHER PUBLICATIONS

José F. da Rocha, Level Shifters and DCVSL for a Low-Voltage Cmos 4.2-V Buck Converter, IEEE Transactions on Industrial Electronics, vol. 55, No. 9, Sep. 2008.

*Primary Examiner* — Thomas J. Hiltunen
(74) *Attorney, Agent, or Firm* — Morgan, Lewis & Bockius LLP

(57) ABSTRACT

A level shifter includes an input block, a shifting block connected to the input block and connected to a power source voltage, a first transistor, a second transistor and a third transistor, and at least one capacitor connected to the input block. A voltage having an anti-phase to the input voltage is boosted by charges previously stored in the at least one capacitor and applied to a gate electrode of the first transistor. When a voltage level of the input voltage transitions from a low level to a high level, the first transistor is turned on by a voltage boosted by the at least one capacitor such that the first node is connected to the power source voltage, and the second transistor is turned off such that the first node is disconnected from the first ground voltage.

20 Claims, 12 Drawing Sheets

100

(56) References Cited

U.S. PATENT DOCUMENTS

| | | | | |
|---|---|---|---|---|
| 9,318,953 | B2 | 4/2016 | Low et al. | |
| 9,385,722 | B2 * | 7/2016 | Trivedi | H03K 3/356113 |
| 9,391,600 | B2 * | 7/2016 | Lau | H03K 17/102 |
| 9,748,957 | B2 | 8/2017 | Kumar | |
| 10,164,524 | B1 * | 12/2018 | Kumar | G11C 7/20 |
| 10,305,482 | B2 | 5/2019 | Chen | |
| 10,319,362 | B2 | 6/2019 | Pattipaka et al. | |
| 10,447,252 | B2 | 10/2019 | Hwang | |
| 2002/0180508 | A1 * | 12/2002 | Kanno | H03K 19/0016<br>327/333 |
| 2003/0169225 | A1 * | 9/2003 | Tobita | H03K 19/018507<br>345/100 |
| 2006/0077166 | A1 * | 4/2006 | Kwon | G09G 5/006<br>345/98 |
| 2007/0139092 | A1 * | 6/2007 | Goncalves | H03K 3/356113<br>327/333 |
| 2014/0232710 | A1 * | 8/2014 | Low | H03K 17/693<br>327/437 |
| 2019/0245526 | A1 | 8/2019 | Satou et al. | |

* cited by examiner

LEVEL SHIFTER INCLUDING CAPACITOR AND METHOD OF OPERATING THE SAME

CROSS-REFERENCE TO RELATED APPLICATIONS

This application claims priority under 35 U.S.C. § 119 to Korean Patent Application No. 10-2024-0006742, filed on Jan. 16, 2024 in the Korean Intellectual Property Office, the disclosure of which is incorporated by reference herein in its entirety.

TECHNICAL FIELD

Embodiments of the present disclosure relate to a level shifter including a capacitor and a method of operating the same.

DISCUSSION OF RELATED ART

Electronic devices may include various elements. Various elements may operate in different voltage domains. Elements belonging to different voltage domains may operate using different power source voltages and different ground voltages.

To exchange signals between elements belonging to different voltage domains, a level shifter may be used. A level shifter may shift a signal belonging to one voltage domain (e.g., a signal that swings between one power source voltage and a ground voltage) to a signal belonging to another voltage domain (e.g., a signal that swings between another power source voltage and another ground voltage).

SUMMARY

Embodiments of the present disclosure provide a level shifter that reduces the power and time consumed to convert the voltage level of an input voltage.

According to an embodiment, a level shifter includes an input block that receives an input voltage through an input terminal, a shifting block connected to the input block through a first node and a second node and connected to a power source voltage, a first transistor connected between the first node and the shifting block, a second transistor and a third transistor connected in series between the first node and a first ground voltage, and at least one capacitor connected to the input block. A voltage having an anti-phase to the input voltage is boosted by charges previously stored in the at least one capacitor and applied to a gate electrode of the first transistor. When a voltage level of the input voltage transitions from a low level to a high level, the first transistor is turned on by a voltage boosted by the at least one capacitor such that the first node is connected to the power source voltage, and the second transistor is turned off such that the first node is disconnected from the first ground voltage.

According to an embodiment, a method of controlling a level shifter includes receiving an input voltage through an input terminal, turning on a first transistor connected between a first node and a power source voltage and turning off a second transistor between the first node and a first ground voltage in response to a voltage level of the input voltage transitioning from a low level to a high level, turning off the first transistor and turning on the second transistor in response to the voltage level of the input voltage transitioning from the low level to the high level, and outputting an output voltage having a level range different from a level range of the input voltage based on a voltage of the first node. Turning on the first transistor includes applying the input voltage boosted by charges previously stored in the input terminal and at least one capacitor to a gate electrode of the first transistor.

According to an embodiment, a level shifting circuit includes an input block that receives an input voltage through an input terminal, a shifting block connected to the input block through a first node and a second node and including a first shifting transistor connected between the first node and a power source voltage, and a second shifting transistor connected between the second node and the power source voltage, a first transistor connected in parallel with the first shifting transistor between the first node and the power source voltage, a second transistor and a third transistor connected in series between the first node and a first ground voltage, and at least one capacitor connected to the input block. A voltage having an anti-phase to the input voltage is boosted by charges previously stored in the at least one capacitor and applied to a gate electrode of the first transistor. When a voltage level of the input voltage transitions from a low level to a high level, the first node is connected to the power source voltage by turning on the first transistor, and the first node is disconnected from the first ground voltage by turning off the second transistor.

According to embodiments of the present disclosure, the level shifter may reduce power and time consumed to convert the voltage level of an input voltage.

BRIEF DESCRIPTION OF THE DRAWINGS

The above and other objects and features of the present disclosure will become more apparent by describing in detail embodiments thereof with reference to the accompanying drawings.

DETAILED DESCRIPTION

Figure 1A:
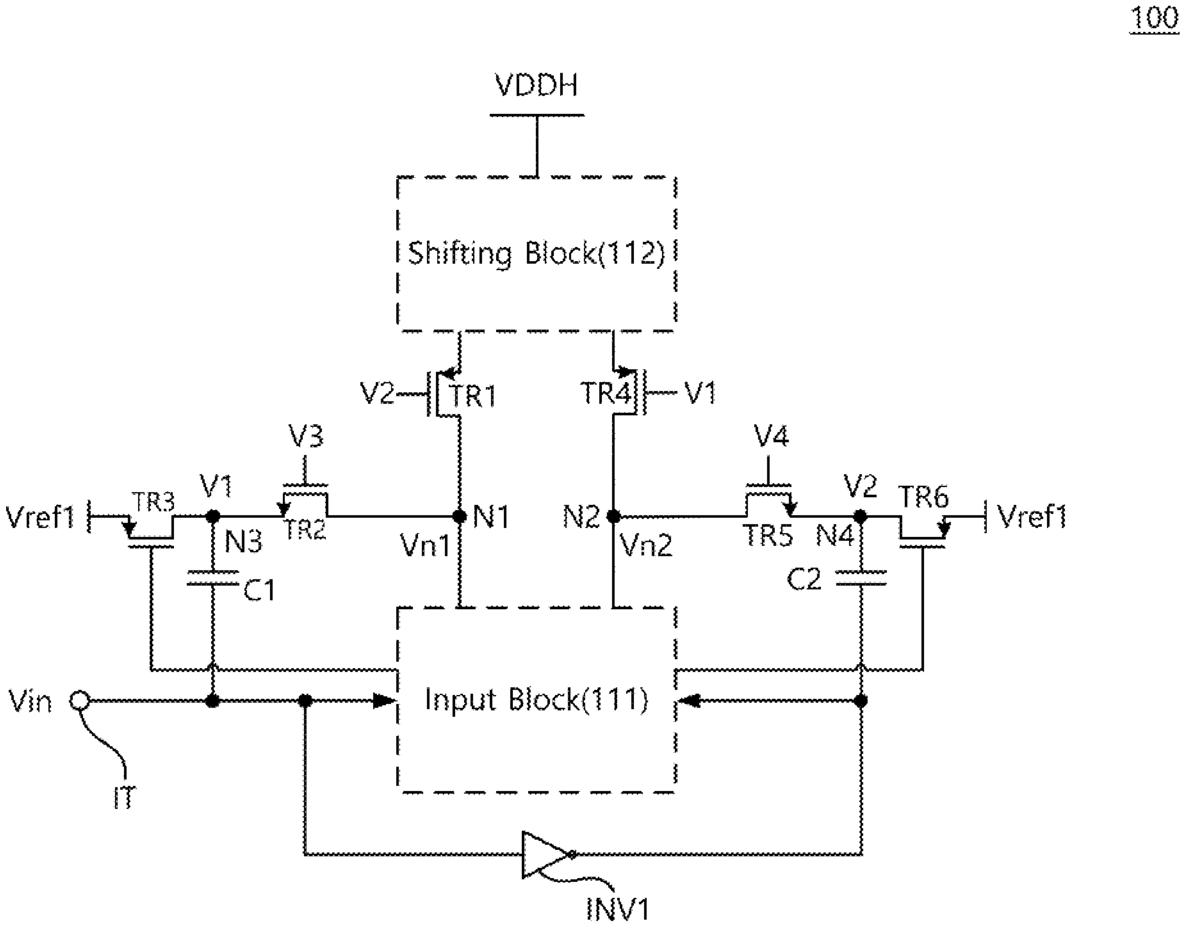
FIG. 1A is a circuit diagram illustrating the configuration of a level shifter according to an embodiment of the present disclosure.

Embodiments of the present disclosure will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an embodiment may be described as a "second" element in another embodiment.

It should be understood that descriptions of features or aspects within each embodiment should typically be considered as available for other similar features or aspects in other embodiments, unless the context clearly indicates otherwise.

As used herein, the singular forms "a", "an" and "the" are intended to include the plural forms as well, unless the context clearly indicates otherwise.

Herein, when two or more elements or values are described as being substantially the same as or about equal to each other, it is to be understood that the elements or values are identical to each other, the elements or values are equal to each other within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations as understood by one of the ordinary skill in the art. Further, it is to be understood that while parameters may be described herein as having "about" a certain value, according to embodiments, the parameter may be exactly the certain value or approximately the certain value within a measurement error as would be understood by a person having ordinary skill in the art. Other uses of these terms and similar terms to describe the relationships between components should be interpreted in a like fashion.

Figure 1B:
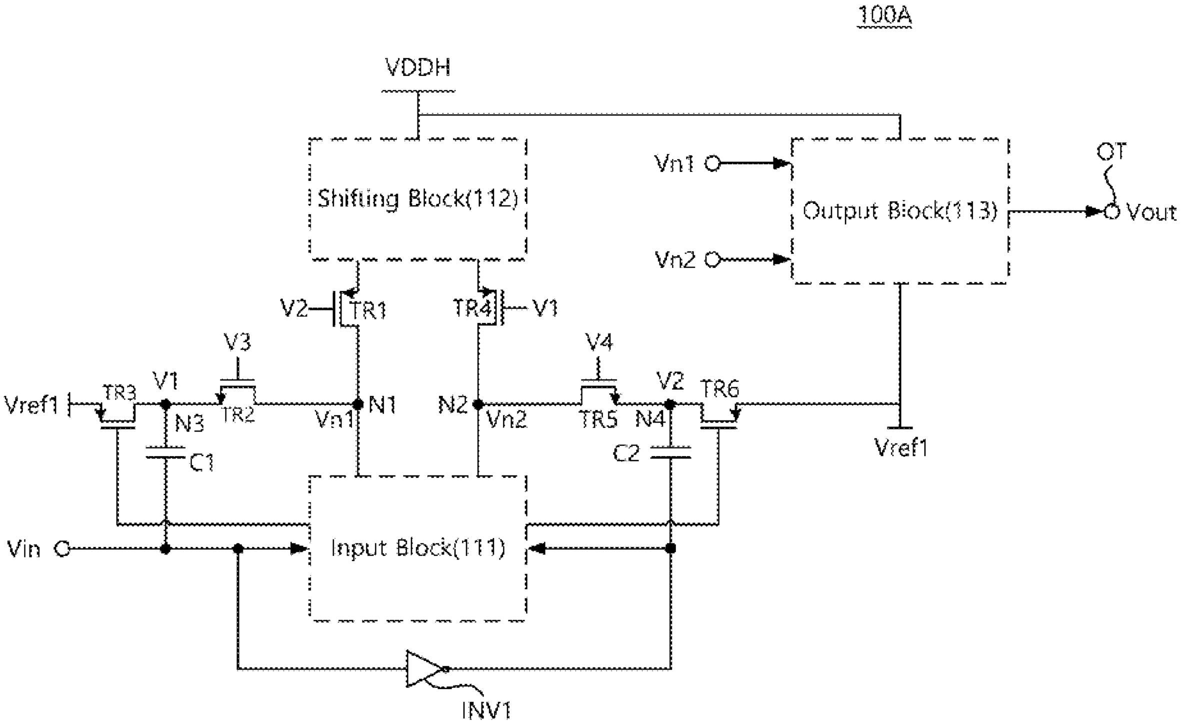
FIG. 1B is a circuit diagram illustrating the configuration of a level shifter according to an embodiment of the present disclosure.

FIG. 1A is a circuit diagram illustrating the configuration of a level shifter according to an embodiment of the present disclosure. FIG. 1B is a circuit diagram illustrating the configuration of a level shifter according to an embodiment of the present disclosure.

Referring to FIGS. 1A and 1B together, a level shifter 100 (also referred to as a level shifter circuit) according to an embodiment may include an input block 111 (also referred to as an input block circuit), a shifting block 112 (also referred to as a shifting block circuit), first to sixth transistors TR1 to TR6, a first capacitor C1, and a second capacitor C2. According to an embodiment, the level shifter 100 may include the input block 111, which receives an input voltage Vin through an input terminal IT.

For example, the level shifter 100 may receive the input voltage Vin through the input terminal IT. In this case, the input voltage Vin received through the input terminal IT may be transmitted to the input block 111.

According to an embodiment, the input block 111 may include a plurality of transistors.

For example, the input block 111 may include a plurality of transistors that discharge a portion of current according to the voltage previously applied to a first node N1 in response to the input voltage Vin.

For example, the input block 111 may leak current from a first node N1 when the voltage level of the input voltage Vin transitions from a high level to a low level. That is, the input block 111 may include a discharging path including a plurality of transistors that leak current from the first node N1.

In addition, the level shifter 100 may include the shifting block 112 connected to the input block 111 through the first node N1 and a second node N2.

According to an embodiment, the shifting block 112 may connect at least a portion of the first node N1 and the second node N2 to a power source voltage VDDH.

For example, the shifting block 112 may include at least two transistors that connect the first node N1 and the second node N2 to the power source voltage VDDH, respectively.

In addition, the level shifter 100 may include the first transistor TR1 connected between the first node N1 and the shifting block 112.

According to an embodiment, the first transistor TR1 may connect or disconnect the first node N1 and the power source voltage VDDH.

In addition, the level shifter 100 may include the second transistor TR2 and the third transistor TR3 connected in series between the first node N1 and a first ground voltage Vref1.

According to an embodiment, the second transistor TR2 and the third transistor TR3 may connect or disconnect the first node N1 and the first ground voltage Vref1.

In addition, the level shifter 100 may include the first capacitor C1 connected between the input terminal IT and the third node N3 between the second transistor TR2 and the third transistor TR3.

According to an embodiment, the input voltage Vin input through the input terminal IT may be boosted by the charge previously stored in the first capacitor C1. In addition, the input voltage Vin may be boosted by the first capacitor C1 and transmitted to the third node N3.

A first voltage V1 of the third node N3 may be referred to as a voltage boosted by the charge previously stored in the first capacitor C1 due to the input voltage Vin.

For example, the input voltage Vin having a level range of about 0 V to about 0.7 V may be boosted by about 0.5V by the first capacitor C1, so that the first voltage V1 of the third node N3 may be referred to as a voltage having a level range of about 0.5V to about 1.2V.

In addition, the level shifter 100 may include a fourth transistor TR4 connected between the second node N2 and the shifting block 112.

The fourth transistor TR4 according to an embodiment may connect or disconnect the second node N2 and the power source voltage VDDH.

In In addition, the level shifter 100 may include a fifth transistor TR5 and a sixth transistor TR6 connected in series between the second node N2 and the first ground voltage Vref1.

The fifth transistor TR5 and TR6 according to an embodiment may connect or disconnect the second node N2 and the first ground voltage Vref1.

In addition, the level shifter 100 may include a first inverter INV1 connected between the input terminal IT and the input block 111.

For example, the level shifter 100 may include the first inverter INV1, which inverts the phase of the input voltage Vin input through the input terminal IT and applies the inverted input voltage Vin to the input block 111.

However, according to an embodiment, the first inverter INV1 may be omitted. That is, the level shifter 100 may further include an additional input terminal that receives a voltage having an anti-phase of the input voltage Vin input through the input terminal IT.

For example, the level shifter 100 may obtain a voltage having an anti-phase of the input voltage Vin input through the input terminal IT and apply the voltage to the input block 111.

In addition, the level shifter 100 may include the second capacitor C2 connected between the first inverter INV1 and the fourth node N4 between the fifth transistor TR5 and the sixth transistor TR6.

According to an embodiment, the input voltage Vin whose phase is inverted by the first inverter INV1 may be boosted by the charge previously stored in the second capacitor C2. In addition, the phase-inverted input voltage Vin may be boosted by the second capacitor C2 and transmitted to the fourth node N4.

In this case, a second voltage V2 of the fourth node N4 may be referred to as a voltage that is boosted by the charge previously stored in the second capacitor C2 after the input voltage Vin is inverted in phase by the first inverter INV1.

For example, a voltage having an anti-phase of the input voltage Vin having a level range of about 0 V to about 0.7 V may be boosted by about 0.5 V by the second capacitor C2, so that the second voltage V2 of the fourth node N4 may be referred to as a voltage having a level range of about 0.5 V to about 1.2 V.

According to an embodiment, the second voltage V2 of the fourth node N4 may be applied to the gate electrode of the first transistor TR1.

For example, the first transistor TR1 may be controlled by the second voltage V2 of the fourth node N4 applied to the gate electrode.

Referring to the above-described configuration, the level shifter 100 may boost the relatively low input voltage Vin through the second capacitor C2 and control the operation of the first transistor TR1 that operates in the level range of the relatively high power source voltage VDDH.

According to an embodiment, the first transistor TR1 may be turned on to connect the first node N1 to the power source voltage VDDH when the voltage level of the input voltage Vin transitions from a low level to a high level.

For example, when the voltage level of the input voltage Vin transitions from a low level to a high level, the phase is reversed and the input voltage Vin having a low level is transmitted through the second capacitor C2. Furthermore, the first transistor TR1 may be turned on when the second voltage V2 of the fourth node N4 is applied to the gate electrode.

Accordingly, when the voltage level of the input voltage Vin transitions from a low level to a high level, the first node N1 may be connected to the power source voltage VDDH through the first transistor TR1.

In addition, when the voltage level of the input voltage Vin transitions from a low level to a high level, the second transistor TR2 may be turned off such that the first node N1 is disconnected from the first ground voltage Vref1.

For example, when the voltage level of the input voltage Vin transitions from a low level to a high level, a third voltage V3 applied to the gate electrode of the second transistor TR2 may decrease so that the second transistor TR2 is turned off.

In this case, as the voltage level of the input voltage Vin transitions from a low level to a high level, it may be understood that the third voltage V3 is anti-phased to the voltage formed at an output terminal OT of the level shifter 100.

That is, when the voltage level of the input voltage Vin transitions from a low level to a high level, the third voltage V3 having a low level formed at the output terminal OT of the level shifter 100 may be applied to the gate electrode to turn off the second transistor TR2.

Accordingly, when the voltage level of the input voltage Vin transitions from a low level to a high level, the first node N1 may be disconnected from the first ground voltage Vref1 by the second transistor TR2.

That is, when the voltage level of the input voltage Vin transitions from a low level to a high level, the first node N1 may be connected to the power source voltage VDDH by the first transistor TR1, and may be disconnected from the first ground voltage Vref1 by the second transistor TR2.

Accordingly, when the voltage level of the input voltage Vin transitions from a low level to a high level, the voltage of the first node N1 may transition from a low level to a high level.

Referring to the above-described configurations, the level shifter 100 may connect the first node N1 to the power source voltage VDDH through a plurality of transistors that operate as the voltage level of the input voltage Vin changes, and may disconnect the first node N1 from the first ground voltage Vref1.

Thus, when the voltage level of the input voltage Vin transitions from a low level to a high level, the level shifter 100 may increase the speed of transitioning the voltage of the first node N1 from a low level to a high level.

In addition, according to an embodiment, the first voltage V1 of the third node N3 may be applied to the gate electrode of the fourth transistor TR4.

For example, the fourth transistor TR4 may be controlled by the first voltage V1 applied from the third node N3 to the gate electrode.

Referring to the above-described configuration, the level shifter 100 may boost the relatively low input voltage Vin through the first capacitor C1 to control the operation of the fourth transistor TR4 that operates in the level range of the relatively high power source voltage VDDH.

According to an embodiment, when the voltage level of the input voltage Vin transitions from a high level to a low level, the fourth transistor TR4 may be turned on such that the second node N2 is connected to the power source voltage VDDH.

For example, when the voltage level of the input voltage Vin transitions from a high level to a low level, the low level input voltage Vin may be transmitted to the third node N3 through the first capacitor C1. Furthermore, the fourth transistor TR4 may be turned on because the first voltage V1 of the third node N3 is applied to the gate electrode.

Accordingly, when the voltage level of the input voltage Vin transitions from a high level to a low level, the second node N2 may be connected to the power source voltage VDDH through the fourth transistor TR4.

In addition, when the voltage level of the input voltage Vin transitions from a high level to a low level, the fifth transistor TR5 may be turned off such that the second node N2 is disconnected from the first ground voltage Vref1.

For example, when the voltage level of the input voltage Vin transitions from a high level to a low level, a fourth voltage V4 applied to the gate electrode of the fifth transistor TR5 may decrease, so that the fifth transistor TR5 is turned off.

In this case, as the voltage level of the input voltage Vin transitions from a high level to a low level, it may be understood that the fourth voltage V4 corresponds to a voltage formed at the output terminal OT of the level shifter 100.

That is, when the voltage level of the input voltage Vin transitions from a high level to a low level, the fourth voltage V4 having a low level formed at the output terminal OT of the level shifter 100 may be applied to the gate electrode to turn off the fifth transistor TR5.

Accordingly, when the voltage level of the input voltage Vin transitions from a high level to a low level, the second node N2 may be disconnected from the first ground voltage Vref1 by the fifth transistor TR5.

That is, when the voltage level of the input voltage Vin transitions from a high level to a low level, the second node N2 may be connected to the power source voltage VDDH by the fourth transistor TR4, and be disconnected from the first ground voltage Vref1 by the fifth transistor TR5.

Thus, when the voltage level of the input voltage Vin transitions from a high level to a low level, the voltage of the second node N2 may transition from a low level to a high level.

Referring to the above-described configurations, the level shifter 100 may connect the second node N2 to the power source voltage VDDH and disconnect the second node N2 from the first ground voltage Vref1 through a plurality of transistors that operate as the voltage level of the input voltage Vin changes.

Thus, when the voltage level of the input voltage Vin transitions from a high level to a low level, the level shifter 100 may increase the speed at which the voltage of the second node N2 transitions from a low level to a high level.

According to an embodiment, when the voltage level of the input voltage Vin transitions from a high level to a low level, the first transistor TR1 may be turned off to disconnect the first node N1 from the power source voltage VDDH.

For example, when the voltage level of the input voltage Vin transitions from a high level to a low level, a voltage whose phase is reversed and has a high level may be boosted by the second capacitor C2 to be transmitted to the fourth node N4.

In this case, the first transistor TR1 may be turned off in response to the difference between the second voltage V2 of the fourth node N4 applied to the gate electrode and the voltage of the source electrode being lower than the threshold voltage of the first transistor TR1.

Accordingly, when the voltage level of the input voltage Vin transitions from a high level to a low level, the first node N1 may be disconnected from the power source voltage VDDH by the first transistor TR1.

In addition, when the voltage level of the input voltage Vin transitions from a high level to a low level, the second transistor TR2 may be turned on such that the first node N1 is connected to the first ground voltage Vref1.

For example, when the voltage level of the input voltage Vin transitions from a high level to a low level, the third voltage V3 applied to the gate electrode of the second transistor TR2 may increase so that the second transistor TR2 is turned on.

In this case, as the voltage level of the input voltage Vin transitions from a high level to a low level, it may be understood that the third voltage V3 has an anti-phase to the voltage formed at the output terminal OT of the level shifter 100.

That is, when the voltage level of the input voltage Vin transitions from a high level to a low level, the third voltage V3 having a high level formed at the output terminal OT of the level shifter 100 may be applied to the gate electrode so that the second transistor TR2 is turned on.

In addition, when the voltage level of the input voltage Vin transitions from a high level to a low level, the third transistor TR3 may be turned on to connect the first node N1 to the first ground voltage Vref1.

For example, when the voltage level of the input voltage Vin transitions from a high level to a low level, the third transistor TR3 may be turned on by the voltage applied from the first node N1 to the gate electrode through the input block 111.

Accordingly, when the voltage level of the input voltage Vin transitions from a high level to a low level, the first node N1 may be connected to the first ground voltage Vref1 by the second transistor TR2 and the third transistor TR3.

That is, when the voltage level of the input voltage Vin transitions from a high level to a low level, the first node N1 may be disconnected from the power source voltage VDDH by the first transistor TR1, and may be connected to the first ground voltage Vref1 by the second transistor TR2 and the third transistor TR3.

Thus, when the voltage level of the input voltage Vin transitions from a high level to a low level, the voltage of the first node N1 may transition from a high level to a low level.

Referring to the above-described configurations, when the voltage level of the input voltage Vin transitions from a high level to a low level, the level shifter 100 may increase the speed at which the voltage of the first node N1 transitions from a high level to a low level.

In addition, referring to the above-described configurations, the level shifter 100 according to an embodiment may change the connection between the first node N1, and the power source voltage VDDH and the first ground voltage Vref1 through transistors that are controlled as the voltage level of the input voltage Vin transitions.

Thus, as the voltage level of the input voltage Vin transitions, the level shifter 100 according to an embodiment of the present disclosure may increase the speed of transitioning the voltage level of the first node N1.

In addition, according to an embodiment, when the voltage level of the input voltage Vin transitions from a low level to a high level, the fourth transistor TR4 may be turned off so that the second node N2 is disconnected from the power source voltage VDDH.

For example, when the voltage level of the input voltage Vin transitions from a low level to a high level, the high level input voltage Vin may be boosted by the first capacitor C1 and transmitted to the third node N3.

Furthermore, the fourth transistor TR4 may be turned off in response to the difference between the first voltage V1 of the third node N3 applied to the gate electrode and the voltage of the source electrode being lower than a threshold voltage of the fourth transistor TR4.

Accordingly, when the voltage level of the input voltage Vin transitions from a low level to a high level, the second node N2 may be disconnected from the power source voltage VDDH by the fourth transistor TR4.

In addition, when the voltage level of the input voltage Vin transitions from a low level to a high level, the fifth transistor TR5 may be turned on so that the second node N2 is connected to the first ground voltage Vref1.

For example, when the voltage level of the input voltage Vin transitions from a low level to a high level, the fourth voltage V4 applied to the gate electrode of the fifth transistor TR5 may increase, so that the fifth transistor TR5 is turned on.

In this case, as the voltage level of the input voltage Vin transitions from a low level to a high level, it may be understood that the fourth voltage V4 corresponds to the voltage formed at the output terminal OT of the level shifter 100.

That is, when the voltage level of the input voltage Vin transitions from a low level to a high level, the fourth voltage V4 having a high level formed at the output terminal OT of the level shifter 100 may be applied to the gate electrode so that the fifth transistor TR5 is turned on.

In addition, when the voltage level of the input voltage Vin transitions from a low level to a high level, the sixth transistor TR6 may be turned on so that the second node N2 is connected to the first ground voltage Vref1.

For example, when the voltage level of the input voltage Vin transitions from a low level to a high level, the sixth transistor TR6 may be turned on by the voltage applied from the second node N2 to the gate electrode through the input block 111.

Accordingly, when the voltage level of the input voltage Vin transitions from a low level to a high level, the second node N2 may be connected to the first ground voltage Vref1 by the fifth transistor TR5 and the sixth transistor TR6.

That is, when the voltage level of the input voltage Vin transitions from a low level to a high level, the second node N2 may be disconnected from the power source voltage VDDH by the fourth transistor TR4, and be connected to the first ground voltage Vref1 through the fifth transistor TR5 and the sixth transistor TR6.

Thus, when the voltage level of the input voltage Vin transitions from a low level to a high level, the voltage of the second node N2 may transition from a high level to a low level.

Referring to the above-described configurations, when the voltage level of the input voltage Vin transitions from a low level to a high level, the level shifter 100 may increase the speed at which the voltage of the second node N2 transitions from a high level to a low level.

In addition, referring to the above-described configurations, the level shifter 100 according to an embodiment may change the connection between the second node N2, and the power source voltage VDDH and the first ground voltage Vref1 through transistors that are controlled as the voltage level of the input voltage Vin transitions.

Thus, the level shifter 100 according to embodiments of the present disclosure may increase the speed of changing the voltage level of the second node N2 as the voltage level of the input voltage Vin transitions.

In addition, referring to FIG. 1B, a level shifter 100A according to an embodiment may further include an output block 113. In this case, the level shifter 100A shown in FIG. 1B may be understood as an example of the level shifter 100 shown in FIG. 1A.

The level shifter 100A may include the output block 113 connected to the output terminal OT between the power source voltage VDDH and the first ground voltage Vref1.

According to an embodiment, the output block 113 may output an output voltage Vout having a level range different from the level range of the input voltage Vin based on the voltage of the first node N1 and the voltage of the second node N2.

For example, the output block 113 may include a plurality of transistors.

In addition, the output block 113 may output the output voltage Vout having a level range different from that of the input voltage Vin based on a first node voltage Vn1 of the first node N1 and a second node voltage Vn2 of the second node N2 received using a plurality of transistors.

For example, the output block 113 may output the output voltage Vout having the level range from the first ground voltage Vref1 to the power source voltage VDDH based on the first node voltage Vn1 and the second node voltage Vn2.

Referring to the above-described configurations, the level shifter 100A according to an embodiment may directly connect each of the first node N1 and the second node N2 to voltage sources (e.g., the power source voltage VDDH and the first ground voltage Vref1) by using the plurality of transistors controlled by the input voltage Vin.

Thus, the level shifter 100A according to embodiments of the present disclosure may reduce a short-circuit current flowing from the first node N1 and the second node N2 to the input block 111 and/or the shifting block 112.

In addition, the level shifter 100A according to embodiments of the present disclosure may reduce the power consumed to control the first node voltage Vn1 of the first node N1 and the second node voltage Vn2 of the second node N2 based on the voltage level of the input voltage Vin.

In addition, the level shifter 100A according to embodiments of the present disclosure may increase the speed of controlling the voltage levels of the first node voltage Vn1 and the second node voltage Vn2.

In other words, the level shifter 100A according to embodiments of the present disclosure may reduce the time and power consumed to output the output voltage Vout having a level range different from that of the input voltage Vin.

Figure 2:
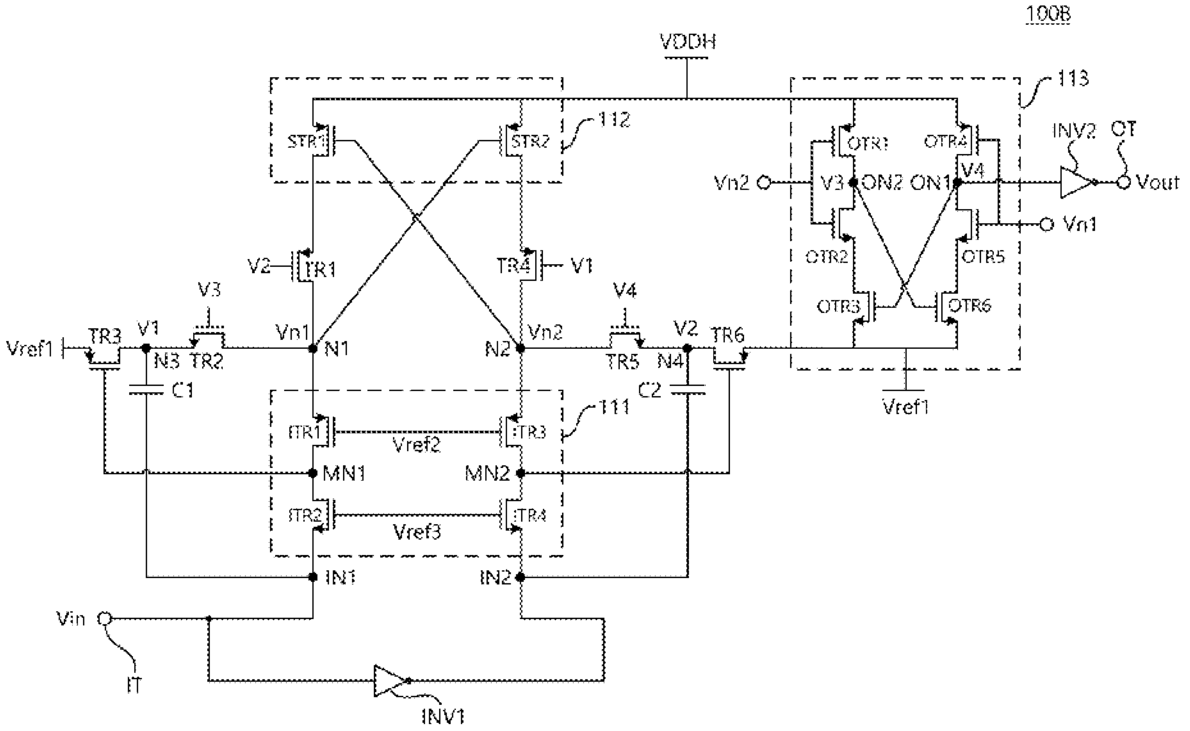
FIG. 2 is a circuit diagram illustrating a specific configuration of a level shifter according to an embodiment.

FIG. 2 is a circuit diagram illustrating a specific configuration of a level shifter according to an embodiment.

Referring to FIG. 2, a level shifter 100B according to an embodiment may include the input block 111, the shifting block 112, and the output block 113, each including a plurality of transistors. In addition, the level shifter 100B may include the first to sixth transistors TR1 to TR6, the first capacitor C1, and the second capacitor C2.

In this case, the level shifter 100B shown in FIG. 2 may be understood as an example of the level shifter 100 shown in FIG. 1A. Accordingly, the same reference numerals may be used for components that are the same or substantially the same as the above-described components, and for convenience of explanation, duplicate descriptions of the same components may be omitted.

According to an embodiment, the input block 111 may include a first input transistor ITR1 and a second input transistor ITR2 connected in series between the first node N1 and a first input node IN1. In this case, the first input node IN1 may be connected to the input terminal IT.

In addition, the input block 111 may include a third input transistor ITR3 and a fourth input transistor ITR4 connected in series between the second node N2 and a second input node IN2.

In this case, for example, the second input node IN2 may be connected to the input terminal IT through the first inverter INV1.

However, in an embodiment, the second input node IN2 may be connected to a separate terminal that receives a voltage having a phase opposite to the input voltage Vin.

According to an embodiment, the first input transistor ITR1 and the third input transistor ITR3 may be operated by a second ground voltage Vref2 applied to each gate electrode.

In this case, for example, the second ground voltage Vref2 may have a voltage value less than or about equal to that of the first ground voltage Vref1.

In addition, the second input transistor ITR2 and the fourth input transistor ITR4 may operate by a third ground voltage Vref3 applied to each gate electrode.

In this case, for example, the third ground voltage Vref3 may have the same voltage value as a high level voltage value in the level range of the input voltage Vin. However, embodiments are not limited thereto.

According to an embodiment, the gate electrode of the third transistor TR3 may be connected to a first intermediate node MN1 between the first input transistor ITR1 and the second input transistor ITR2.

Accordingly, when the voltage level of the input voltage Vin transitions from a high level to a low level, the voltage formed at a low level in the first intermediate node MN1 may be applied to the gate electrode of the third transistor TR3, so that the third transistor TR3 is turned on.

In addition, when the voltage level of the input voltage Vin transitions from a low level to a high level, the voltage formed at a high level in the first intermediate node MN1 may be applied to the gate electrode of the third transistor TR3, so that the third transistor TR3 is turned off.

In this case, as the third transistor TR3 is turned off, the electrical connection between the voltage source of the first ground voltage Vref1 and the first node N1 (or the level shifter 100B) may be disconnected.

Thus, the level shifter 100B according to an embodiment of the present disclosure may reduce the effect of changes in voltage level of the first node N1 (or the first node voltage Vn1) on the voltage source of the first ground voltage Vref1.

In addition, the gate electrode of the sixth transistor TR6 may be connected to a second intermediate node MN2 between the third input transistor ITR3 and the fourth input transistor ITR4.

Accordingly, when the voltage level of the input voltage Vin transitions from a low level to a high level, the voltage formed at a low level in the second intermediate node MN2 may be applied to the gate electrode of the sixth transistor TR6, so that the sixth transistor TR6 is turned on.

In addition, when the voltage level of the input voltage Vin transitions from a high level to a low level, the voltage formed at a high level in the second intermediate node MN2 may be applied to the gate electrode of the sixth transistor TR6, so that the sixth transistor TR6 is turned off.

In this case, as the sixth transistor TR6 is turned off, the electrical connection between the voltage source of the first ground voltage Vref1 and the second node N2 (or the level shifter 100B) may be disconnected.

Thus, the level shifter 100B according to an embodiment of the present disclosure may reduce the effect of changes in voltage level of the second node N2 (or the second node voltage Vn2) on the voltage source of the first ground voltage Vref1.

Referring to the above-described configurations, the level shifter 100B may increase the stability of the first ground voltage Vref1 through the third transistor TR3 and the sixth transistor TR6.

In addition, through the above-described configurations, the level shifter 100B may omit a separate circuit utilized to maintain the stability of the first ground voltage Vref1.

Accordingly, the level shifter 100B may have a reduced area and may operate with reduced power.

In addition, the level shifter 100B may include the shifting block 112 connected between the first and second transistors TR1 and TR2 and the power source voltage VDDH.

The shifting block 112 according to an embodiment may include a first shifting transistor STR1 and a second shifting transistor STR2.

For example, the shifting block 112 may include the first shifting transistor STR1 connected between the first transistor TR1 and the power source voltage VDDH.

In this case, the gate electrode of the first shifting transistor STR1 may be connected to the second node N2. Accordingly, the first shifting transistor STR1 may be controlled by the second node voltage Vn2 of the second node N2.

According to an embodiment, the first shifting transistor STR1 may connect the first node N1 and the power source voltage VDDH in response to the first transistor TR1 being turned on.

In addition, the shifting block 112 may include the second shifting transistor STR2 connected between the fourth transistor TR4 and the power source voltage VDDH.

In this case, the gate electrode of the second shifting transistor STR2 may be connected to the first node N1. Accordingly, the second shifting transistor STR2 may be controlled by the first node voltage Vn1 of the first node N1.

According to an embodiment, the second shifting transistor STR2 may connect the second node N2 and the power source voltage VDDH in response to the fourth transistor TR4 being turned on.

In addition, the level shifter 100B may include the output block 113 connected to the output terminal OT.

For example, the level shifter 100B may include the output block 113 connected to the output terminal OT between the power source voltage VDDH and the first ground voltage Vref1.

According to an embodiment, the output block 113 may include a plurality of output transistors OTR1 to OTR6.

For example, the output block 113 may include the plurality of output transistors OTR1 to OTR6 connected between the power source voltage VDDH and the first ground voltage Vref1.

For example, the output block 113 may include the first output transistor OTR1, the second output transistor OTR2, and the third output transistor OTR3 connected in series between the power source voltage VDDH and the first ground voltage Vref1.

In addition, the output block 113 may include the fourth output transistor OTR4, the fifth output transistor OTR5, and the sixth output transistor OTR6 connected in series between the power source voltage VDDH and the first ground voltage Vref1.

According to an embodiment, based on the first node voltage Vn1 and the second node voltage Vn2, the output block 113 may output the output voltage Vout through the plurality of output transistors OTR1 to OTR6.

For example, when the voltage level of the first node voltage Vn1 transitions from a low level to a high level, the voltage level of the fourth voltage V4 of a first output node ON1 between the fourth output transistor OTR4 and the fifth output transistor OTR5 may transition from a high level to a low level.

In addition, when the voltage level of the second node voltage Vn2 transitions from a high level to a low level, the voltage level of the third voltage V3 of a second output node ON2 between the first output transistor OTR 1 and the second output transistor OTR2 may transition from a low level to a high level.

In this case, each voltage level of the first output node ON1 and the second output node ON2 may swing between the power source voltage VDDH and the first ground voltage Vref1.

In addition, the output block 113 may invert the fourth voltage V4 of the first output node ON1 through a second inverter INV2 and output the inverted voltage as the output voltage Vout through the output terminal OT.

Referring to the above-described configurations, the level shifter 100B according to an embodiment may output the output voltage Vout in a level range different from that of the input voltage Vin based on the voltage levels of the first node N1 and the second node N2 controlled in response to the input voltage Vin being applied.

In this case, the level shifter 100B may increase the speed at which the voltage levels of the first node N1 and the second node N2, which are controlled as the voltage level of the input voltage Vin transitions, transition.

Accordingly, as the input voltage Vin is input, the level shifter 100B according to an embodiment of the present disclosure may reduce the time taken to output the output voltage Vout in a level range different from that of the input voltage Vin.

Figure 3:
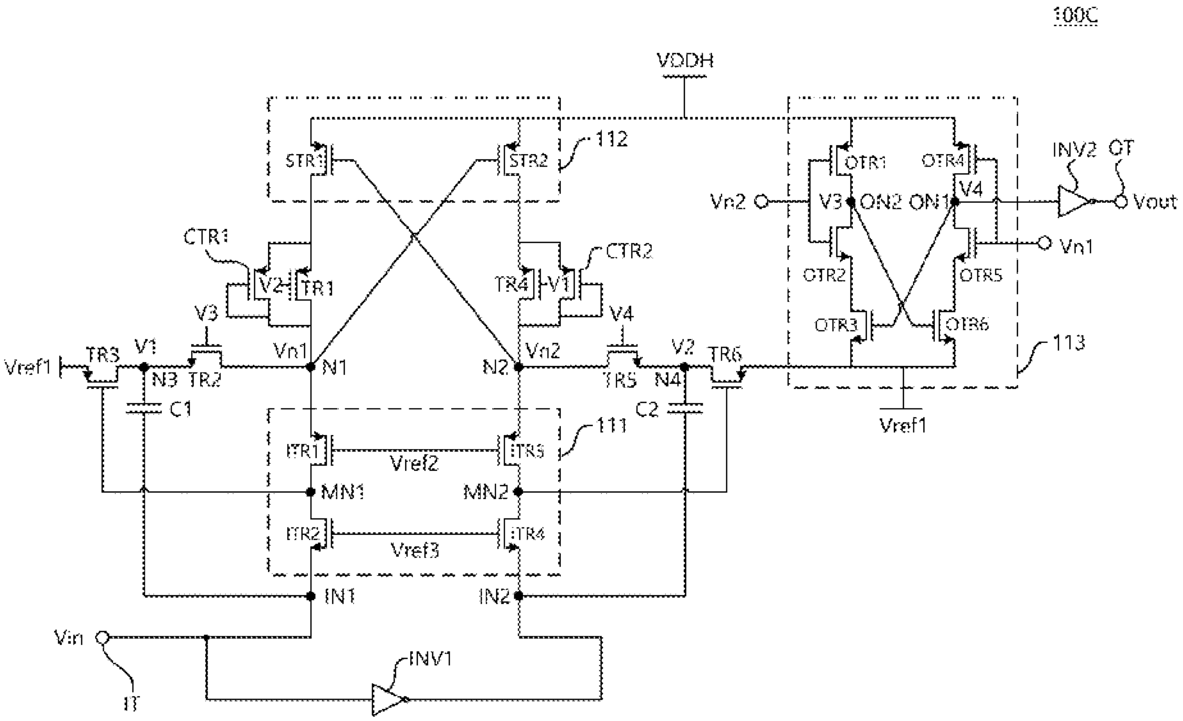
FIG. 3 is a circuit diagram illustrating the configuration of a level shifter further including a first control transistor and a second control transistor according to an embodiment.

FIG. 3 is a circuit diagram illustrating the configuration of a level shifter further including a first control transistor and a second control transistor according to an embodiment.

Referring to FIG. 3, a level shifter 100C according to an embodiment includes the input block 111, the shifting block 112, the first to sixth transistors TR1 to TR6, the first capacitor C1, the second capacitor C2, a first control transistor CTR1, and a second control transistor CTR2.

In this case, the level shifter 100C shown in FIG. 3 may be understood as an example of the level shifter 100 shown in FIG. 1A. Accordingly, the same reference numerals may be used for components that are the same or substantially the same as the above-described components, and for convenience of explanation, duplicate descriptions of the same components may be omitted.

According to an embodiment, the level shifter 100C may include the first control transistor CTR1 connected in parallel with the first transistor TR1.

In this case, a gate electrode and a drain electrode of the first control transistor CTR1 may be connected to each other. Accordingly, the first control transistor CTR1 may be understood as being diode-connected to the first transistor TR1.

According to an embodiment, the voltage difference between the source electrode and the drain electrode of the first transistor TR1 may be maintained to be lower than or about equal to a threshold voltage of the first control transistor CTR1.

Accordingly, the level shifter 100C may reduce the voltage stress applied to the first transistor TR1 due to the power source voltage VDDH.

In addition, according to an embodiment, the level shifter 100C may include the second control transistor CTR2 connected in parallel with the fourth transistor TR4.

In this case, a gate electrode and a drain electrode of the second control transistor CTR2 may be connected to each other. Accordingly, the second control transistor CTR2 may be understood as diode-connected to the fourth transistor TR4.

According to an embodiment, the voltage difference between the source electrode and the drain electrode of the fourth transistor TR4 may be maintained to be lower than or about equal to a threshold voltage of the second control transistor CTR2.

Accordingly, the level shifter 100C may reduce the voltage stress applied to the second transistor TR2 due to the power source voltage VDDH.

Referring to the above-described configurations, the level shifter 100C according to an embodiment of the present disclosure may reduce the voltage stress applied to the first transistor TR1 and the second transistor TR2 due to the power source voltage VDDH.

Figure 4:
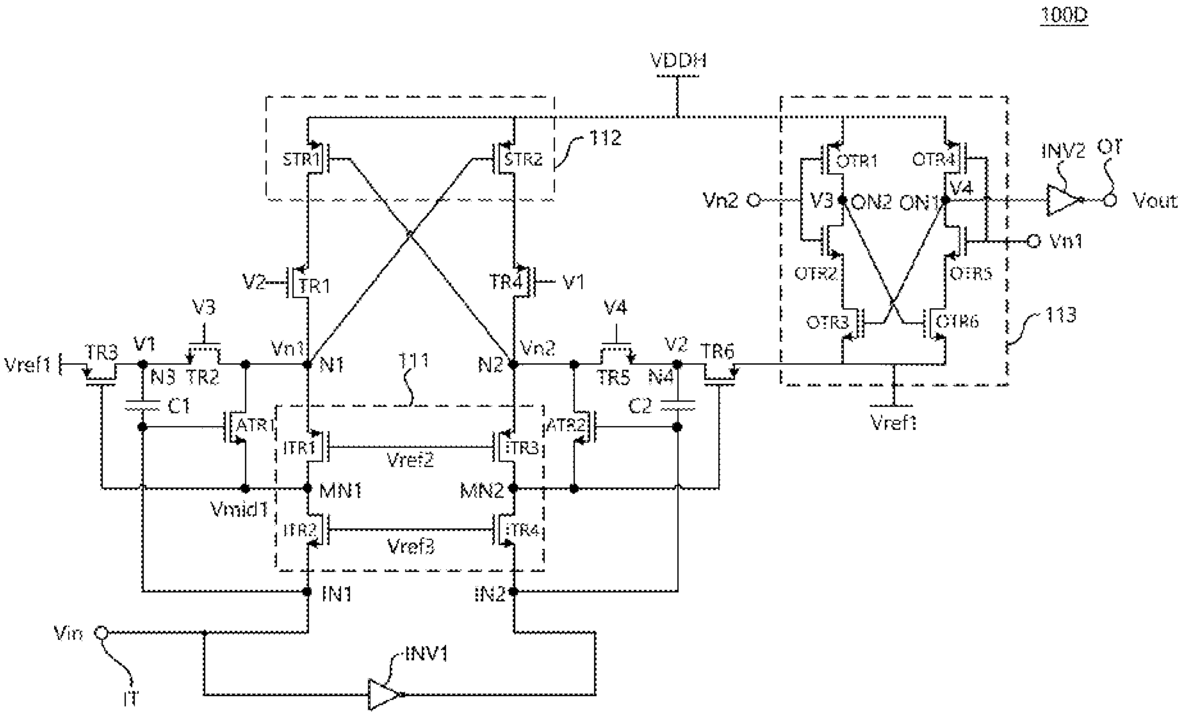
FIG. 4 is a circuit diagram illustrating the configuration of a level shifter further including a first additional transistor and a second additional transistor according to an embodiment.

FIG. 4 is a circuit diagram illustrating the configuration of a level shifter further including a first additional transistor and a second additional transistor according to an embodiment.

Referring to FIG. 4, a level shifter 100D according to an embodiment may include the input block 111, the shifting block 112, the first to sixth transistors TR1 to TR6, the first capacitor C1, the second capacitor C2, a first additional transistor ATR1, and a second additional transistor ATR2.

In this case, the level shifter 100D shown in FIG. 4 may be understood as an example of the level shifter 100 shown in FIG. 1A. Accordingly, the same reference numerals may be used for components that are the same or substantially the same as the above-described components, and for convenience of explanation, duplicate descriptions of the same components may be omitted.

According to an embodiment, the level shifter 100D may include the first additional transistor ATR1 connected between the first node N1 and the first intermediate node MN1.

The level shifter 100D may include the first additional transistor ATR1 connected between the first node N1 and the gate electrode of the third transistor TR3.

That is, the source electrode of the first additional transistor ATR1 may be connected to the first node N1, and the drain electrode may be connected to the first intermediate node MN1 and the gate electrode of the third transistor TR3.

In addition, the gate electrode of the first additional transistor ATR1 may be connected to the input terminal IT to receive the input voltage Vin.

According to an embodiment, in response to the voltage level of the input voltage Vin transitioning from a low level to a high level, the input voltage Vin having a high level may be applied to the gate electrode of the first additional transistor ATR1, so that the first additional transistor ATR1 may be turned on.

For example, in response to the voltage level of the input voltage Vin transitioning from a low level to a high level, the first additional transistor ATR1 may be turned on to apply the first node voltage Vn1 of the first node N1 to the gate electrode of the third transistor TR3.

In response to the first additional transistor ATR1 being turned on as the voltage level of the input voltage Vin transitions from a low level to a high level, the first node voltage Vn1 at a high level may be applied to the gate electrode of the third transistor TR3.

In addition, the third transistor TR3 may be turned off in response to the first node voltage Vn1 at a high level being applied to the gate electrode of the third transistor TR3.

In addition, the first transistor TR1 may be turned on by the second voltage V2. In addition, the first shifting transistor STR1 may be turned on as the second node voltage Vn2 transitions to a low level.

Accordingly, the first node N1 may be connected to the power source voltage VDDH through the first transistor TR1 and the first shifting transistor STR1. In addition, the first node voltage Vn1 may transition from a low level to a high level.

Furthermore, as the first node voltage Vn1 transitions to a high level, the first transistor TR1 may be turned on.

Referring to the above-described configurations, the level shifter 100D according to an embodiment may provide the first node voltage Vn1 to the gate electrode of the third transistor TR3 through the first additional transistor ATR1 in response to the voltage level of the input voltage Vin transitioning from a low level to a high level.

Accordingly, in response to the voltage level of the input voltage Vin transitioning from a low level to a high level, the level shifter 100D may momentarily disconnect the first node N1 and the first ground voltage Vref1 regardless of the size of the first input transistor ITR1.

Thus, when the voltage level of the input voltage Vin transitions from a low level to a high level, the level shifter 100D according to an embodiment of the present disclosure may increase the speed at which the first node voltage Vn1 transitions from a low level to a high level.

According to an embodiment, the level shifter 100D may include the second additional transistor ATR2 connected between the second node N2 and the second intermediate node MN2.

The level shifter 100D may include the second additional transistor ATR2 connected between the second node N2 and the gate electrode of the sixth transistor TR6.

That is, the source electrode of the second additional transistor ATR2 may be connected to the second node N2, and the drain electrode may be connected to the second intermediate node MN2 and the gate electrode of the sixth transistor TR6.

In addition, the gate electrode of the second additional transistor ATR2 may be connected to the first inverter INV1 to receive the input voltage Vin whose phase is inverted.

According to an embodiment, in response to the voltage level of the input voltage Vin transitioning from a high level to a low level, a high level voltage may be applied to the gate electrode of the second additional transistor ATR2 so that the second additional transistor ATR2 is turned on.

For example, in response to the voltage level of the input voltage Vin transitioning from a high level to a low level, the second additional transistor ATR2 may be turned on to apply the second node voltage Vn2 of the second node N2 to the gate electrode of the sixth transistor TR6.

In response to the second additional transistor ATR2 being turned on as the voltage level of the input voltage Vin transitions from a high level to a low level, the second node voltage Vn2 at a high level may be applied to the gate electrode of the sixth transistor TR6.

In addition, in response to the second node voltage Vn2 at a high level being applied to the gate electrode of the sixth transistor TR6, the sixth transistor TR6 may be turned off.

In addition, the fourth transistor TR4 may be turned on by the first voltage V1. In addition, the second shifting transistor STR2 may be turned on as the first node voltage Vn1 transitions to a low level.

Accordingly, the second node N2 may be connected to the power source voltage VDDH through the fourth transistor TR4 and the second shifting transistor STR2. In addition, the second node voltage Vn2 may transition from a low level to a high level.

Referring to the above-described configurations, when the voltage level of the input voltage Vin transitions from a high level to a low level, the level shifter 100D according to an embodiment may use the second additional transistor ATR2 to transmit the second node voltage Vn2 to the gate electrode of the sixth transistor TR6.

Accordingly, in response to the voltage level of the input voltage Vin transitioning from a high level to a low level, the level shifter 100D may momentarily disconnect the second node N2 and the first ground voltage Vref1 regardless of the size of the third input transistor ITR3.

Thus, when the voltage level of the input voltage Vin transitions from a high level to a low level, the level shifter 100D according to an embodiment of the present disclosure may increase the speed at which the second node voltage Vn2 of the second node N2 transitions from a low level to a high level.

Referring to the above-described configurations, the level shifter 100D according to an embodiment may transmit the first node voltage Vn1 and the second node voltage Vn2 to the gate electrodes of the third transistor TR3 and the sixth transistor TR6 through the first additional transistor ATR1 and the second additional transistor ATR2, respectively.

Thus, in response to the transition of the voltage level of the input voltage Vin, the level shifter 100D may momentarily turn off the third transistor TR3 and sixth transistor TR6 regardless of the sizes of the first input transistor ITR1 and the third input transistor ITR3.

Accordingly, the level shifter 100D according to an embodiment of the present disclosure may increase the speed at which the first node voltage Vn1 or the second node voltage Vn2 transitions from a low level to a high level.

In addition, referring to the above-described configurations, the level shifter 100D may reduce the sizes of the first input transistor ITR1 and the third input transistor ITR3.

Thus, the level shifter 100D according to an embodiment of the present disclosure may have a reduced area.

Figure 5:
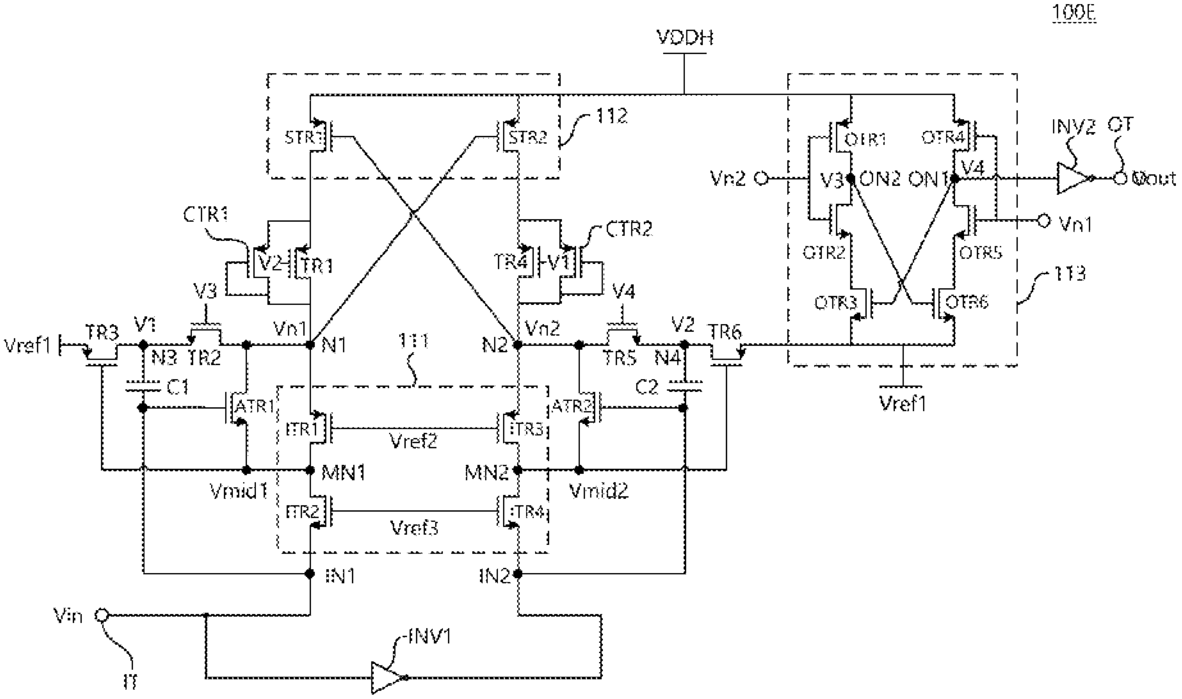
FIG. 5 is a circuit diagram illustrating the configuration of a level shifter further including a first control transistor, a second control transistor, a first additional transistor, and a second additional transistor according to an embodiment.
Figure 6A:
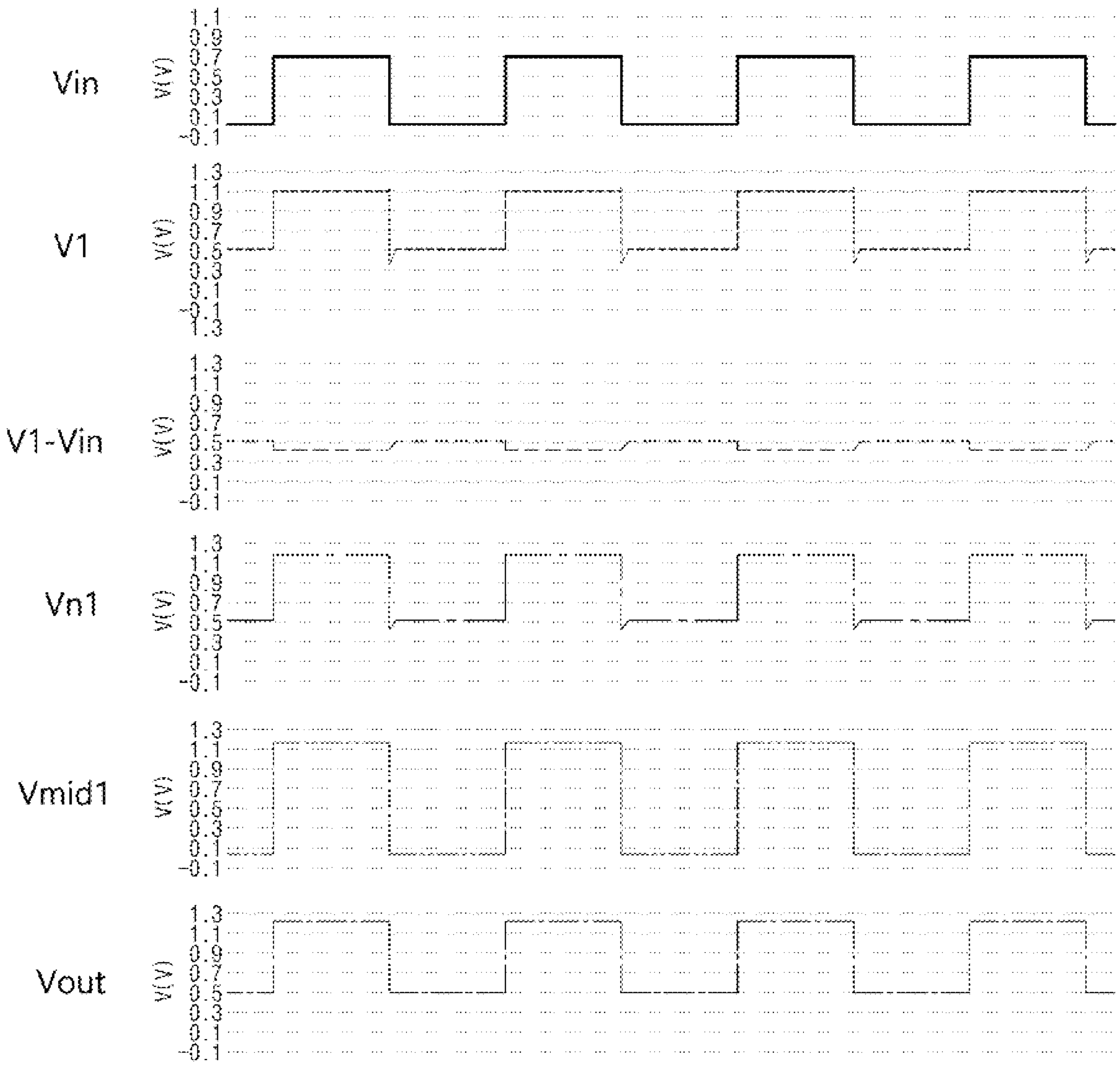
FIG. 6A is a graph illustrating the voltage change at each node as the voltage level of an input voltage changes, according to an embodiment.
Figure 6B:
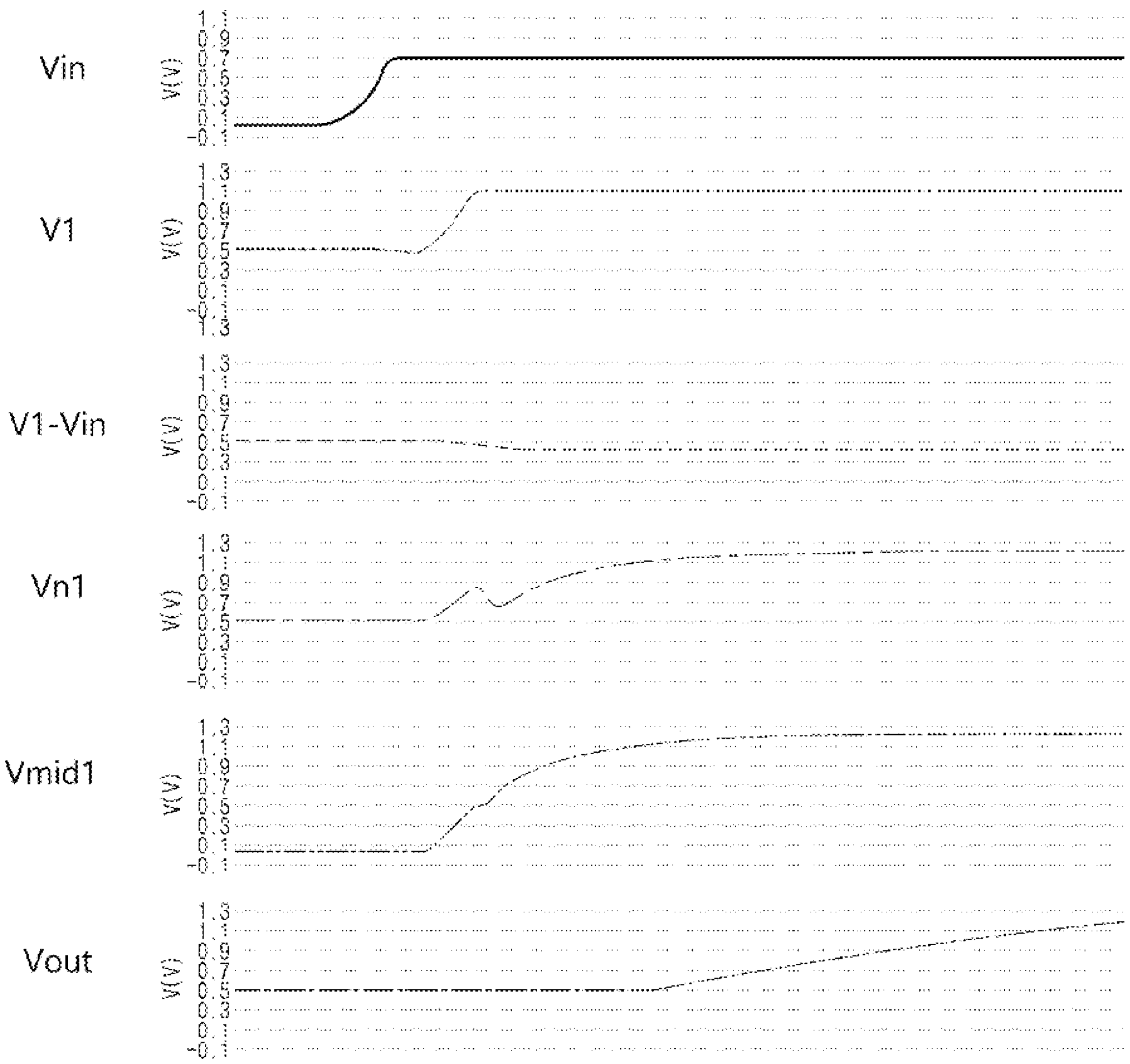
FIG. 6B is a graph illustrating a change in voltage at each node as the voltage level of an input voltage transitions from a low level to a high level, according to an embodiment.
Figure 6C:
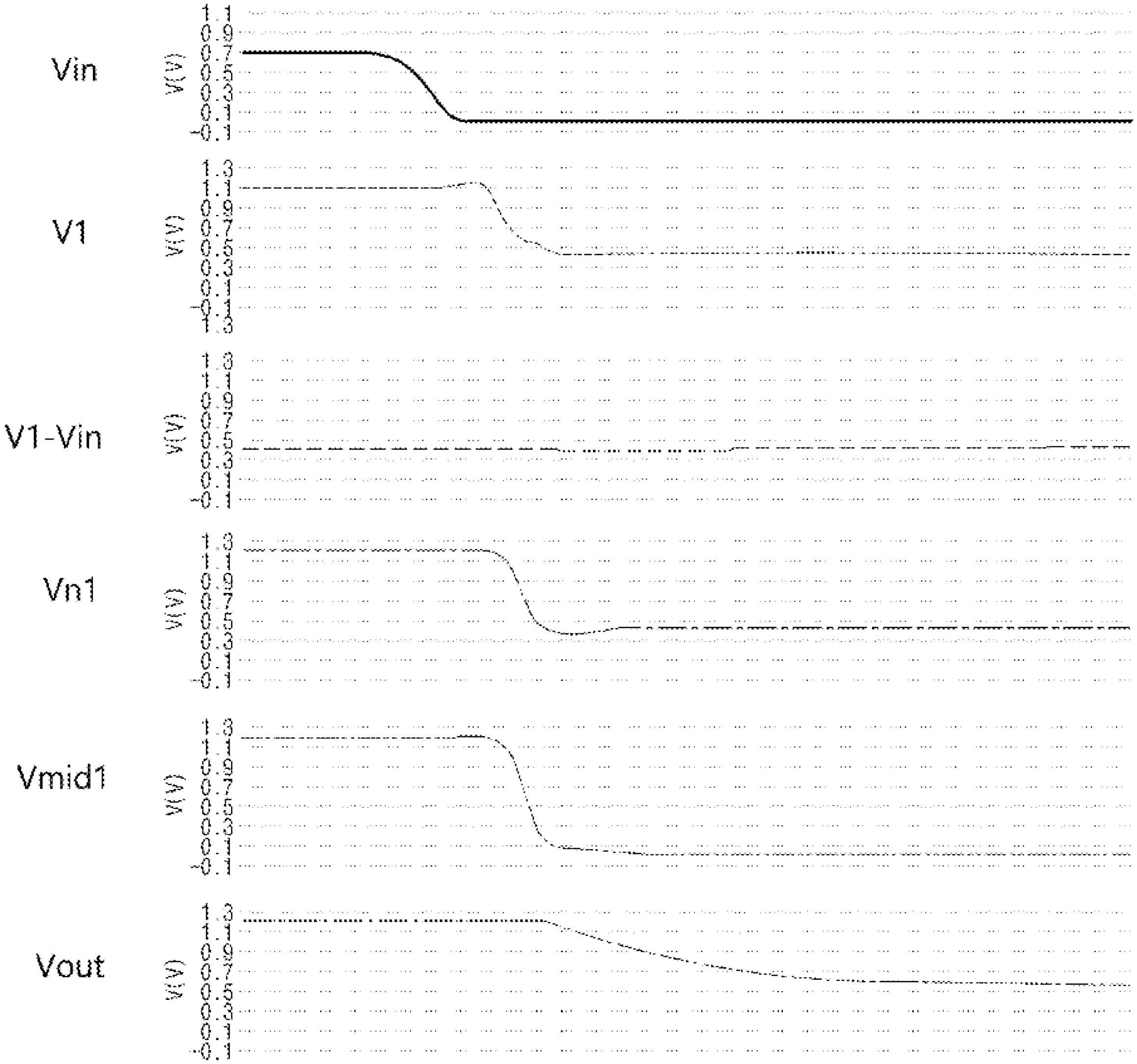
FIG. 6C is a graph illustrating a change in voltage at each node as the voltage level of an input voltage transitions from a high level to a low level, according to an embodiment.

FIG. 5 is a circuit diagram illustrating the configuration of a level shifter further including a first control transistor, a second control transistor, a first additional transistor, and a second additional transistor according to an embodiment. FIG. 6A is a graph illustrating the voltage change at each node as the voltage level of an input voltage changes, according to an embodiment. FIG. 6B is a graph illustrating a change in voltage at each node as the voltage level of an input voltage transitions from a low level to a high level, according to an embodiment. FIG. 6C is a graph illustrating a change in voltage at each node as the voltage level of an input voltage transitions from a high level to a low level, according to an embodiment.

Referring to FIG. 5, a level shifter 100E according to an embodiment may include the input block 111, the shifting block 112, the first to sixth transistors TR1 to TR6, the first capacitor C1, the second capacitor C2, the first control transistor CTR1, the second control transistor CTR2, the first additional transistor ATR1, and the second additional transistor ATR2.

In this case, the level shifter 100E shown in FIG. 5 may be understood as an example of the level shifter 100 shown in FIG. 1A. Accordingly, the same reference numerals may be used for components that are the same or substantially the same as the above-described components, and for convenience of explanation, duplicate descriptions of the same components may be omitted.

According to an embodiment, the level shifter 100E may include the first control transistor CTR1 that is connected in parallel with the first transistor TR1 and whose gate electrode and drain electrode are connected to each other.

The voltage difference between the source electrode and the drain electrode of the first transistor TR1 may be maintained to be lower than or about equal to the threshold voltage of the first control transistor CTR1.

Accordingly, the level shifter 100E may reduce the voltage stress applied to the first transistor TR1 due to the power source voltage VDDH by using the first control transistor CTR1.

In addition, according to an embodiment, the level shifter 100E may include the second control transistor CTR2, which is connected in parallel with the fourth transistor TR4 and whose gate electrode and drain electrode are connected to each other.

The voltage difference between the source electrode and the drain electrode of the fourth transistor TR4 may be maintained to be lower than or about equal to a threshold voltage of the second control transistor CTR2.

Accordingly, the level shifter 100E may reduce the voltage stress applied to the second transistor TR2 due to the power source voltage VDDH.

In addition, the level shifter 100E according to an embodiment may include the first additional transistor ATR1 connected between the first node N1 and the gate electrode of the third transistor TR3.

The gate electrode of the first additional transistor ATR1 may be connected to the input terminal IT to receive the input voltage Vin.

According to an embodiment, in response to the voltage level of the input voltage Vin transitioning from a low level to a high level, the input voltage Vin having a high level may be applied to the gate electrode of the first additional transistor ATR1, so that the first additional transistor ATR1 may be turned on.

In response to the first additional transistor ATR1 being turned on as the voltage level of the input voltage Vin transitions from a low level to a high level, the first node voltage Vn1 at a low level may be applied to the gate electrode of the third transistor TR3.

In addition, in response to the first node voltage Vn1 at a low level being applied to the gate electrode of the third transistor TR3, the third transistor TR3 may be turned off. Thus, the connection between the first node N1 and the first ground voltage Vref1 may be disconnected.

In addition, the level shifter 100E according to an embodiment may include the second additional transistor ATR2 connected between the second node N2 and the gate electrode of the sixth transistor TR6.

In addition, the gate electrode of the second additional transistor ATR2 may be connected to the first inverter INV1 to receive the input voltage Vin whose phase is inverted.

According to an embodiment, in response to the voltage level of the input voltage Vin transitioning from a high level to a low level, a high level voltage may be applied to the gate electrode of the second additional transistor ATR2 so that the second additional transistor ATR2 is turned on.

In response to the second additional transistor ATR2 being turned on as the voltage level of the input voltage Vin transitions from a high level to a low level, the second node voltage Vn2 at a low level may be applied to the gate electrode of the sixth transistor TR6.

In addition, in response to the second node voltage Vn2 at a low level being applied to the gate electrode of the sixth transistor TR6, the sixth transistor TR6 may be turned off. Thus, the connection between the second node N2 and the first ground voltage Vref1 may be disconnected.

Referring to the above-described configurations, the level shifter 100E according to an embodiment may transmit the first node voltage Vn1 and the second node voltage Vn2 to the gate electrodes of the third transistor TR3 and the sixth transistor TR6 through the first additional transistor ATR1 and the second additional transistor ATR2, respectively.

Thus, in response to the transition of the voltage level of the input voltage Vin to a high level, the level shifter 100E may momentarily turn off the third transistor TR3 regardless of the size of the first input transistor ITR1.

In addition, in response to the transition of the voltage level of the input voltage Vin to a low level, the level shifter 100E may turn off the sixth transistor TR6 regardless of the size of the third input transistor ITR3.

Therefore, the level shifter 100E according to an embodiment of the present disclosure may increase the speed at which the first node voltage Vn1 or the second node voltage Vn2 transitions from a low level to a high level.

Referring to FIG. 5 and FIGS. 6A to 6C together, the level shifter 100E according to an embodiment may receive the input voltage Vin having a level range of about 0 V to about 0.7 V, and output the output voltage Vout having a level range of about 0.5 V to about 1.2 V.

In this case, it is assumed that the power source voltage VDDH has a voltage value of about 1.2 V and the first ground voltage Vref1 has a voltage value of about 0.5 V.

According to an embodiment, the level shifter 100E may receive the input voltage Vin having a level range of about 0 V to about 0.7 V through the input terminal IT.

In addition, the input voltage Vin may be boosted by the first capacitor C1 and transmitted to the third node N3.

For example, the input voltage Vin having a level range of about 0 V to about 0.7 V may be boosted by the first capacitor C1, so that the first voltage V1 of the third node N3 has a level range of about 0.5 V to about 1.1 V.

However, the level range of the first voltage V1 of the third node N3 is not limited to the above-described examples, and may vary depending on the operating characteristics of each transistor and capacitor.

In addition, for example, "V1−Vin", which corresponds to the voltage difference between both terminals of the first capacitor C1, may be maintained at about 0.5 V.

In addition, "V1−Vin" corresponding to the voltage difference between both terminals of the first capacitor C1 is not limited to the above-mentioned value.

In addition, when the input voltage Vin transitions from a low level to a high level, the first transistor TR1 may be turned on by the second voltage V2 which anti-phased to the first voltage V1 and has a low level.

For example, when the input voltage Vin transitions from a low level to a high level, the first transistor TR1 may be turned on by the second voltage V2 at a level of about 0.5 V.

Furthermore, the first node N1 may be connected to the power source voltage VDDH through the first transistor TR1.

In addition, when the input voltage Vin transitions from a low level to a high level, a first intermediate voltage Vmid1 of the first intermediate node MN1 may transition to about 1.2 V by the first additional transistor ATR1.

For example, when the input voltage Vin transitions from a low level to a high level, the first intermediate voltage Vmid1 may transition to about 1.2 V which is about equal to the first node voltage Vn1 through the first additional transistor ATR1.

Furthermore, as the voltage level of the first intermediate voltage Vmid1 transitions to a high level (e.g., about 1.2 V), the third transistor TR3 may be turned off.

Accordingly, when the input voltage Vin transitions from a low level to a high level, the first node N1 may be disconnected from the first ground voltage Vref1.

According to an embodiment, when the input voltage Vin transitions from a high level to a low level, the first transistor TR1 may be turned off by the second voltage V2 which is anti-phased to the first voltage V1 and has a high level.

For example, the first transistor TR1 may be turned off by the second voltage V2 at a level of about 1.1 V. Furthermore, the first node N1 may be disconnected from the power source voltage VDDH by the first transistor TR1.

In addition, when the input voltage Vin transitions from a high level to a low level, the first intermediate voltage Vmid1 of the first intermediate node MN1 may transition to about 0 V by the first additional transistor ATR1.

In addition, when the input voltage Vin transitions from a high level to a low level, the first node N1 may be connected to the first ground voltage Vref1.

Referring to the above-described configurations, the level shifter 100E may directly connect or disconnect the first node N1 to or from the power source voltage VDDH or the first ground voltage Vref1 by using a plurality of transistors controlled by the level change of the input voltage Vin.

Thus, the level shifter 100E according to embodiments of the present disclosure may reduce the power consumed to control the voltage level of the first node voltage Vn1.

In addition, the level shifter 100E according to embodiments of the present disclosure may increase the speed of controlling the voltage level of the first node voltage Vn1.

In other words, the level shifter 100E according to embodiments of the present disclosure may reduce the time and power consumed to output the output voltage Vout having a level range different from that of the input voltage Vin.

Figure 7:
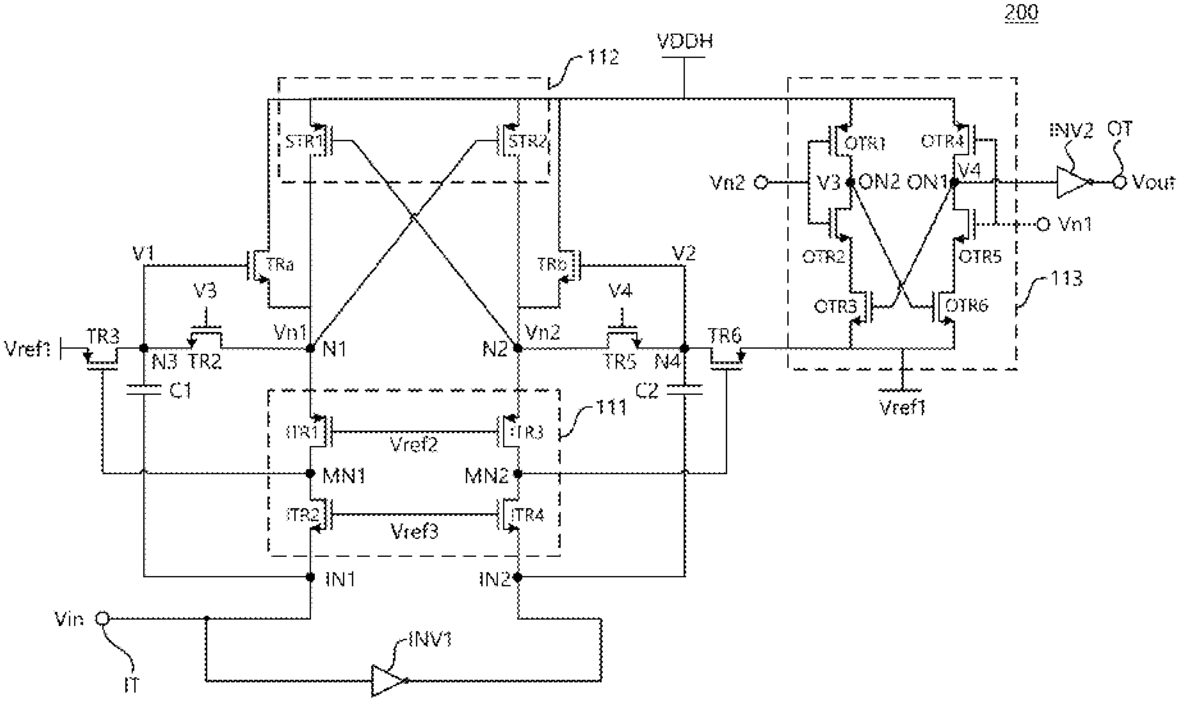
FIG. 7 is a circuit diagram illustrating the configuration of a level shifter according to an embodiment.

FIG. 7 is a circuit diagram illustrating the configuration of a level shifter according to an embodiment.

Referring to FIG. 7, a level shifter 200 according to an embodiment may include the input block 111, the shifting block 112, the output block 113, a plurality of transistors, the first capacitor C1, and the second capacitor C2.

In this case, the plurality of transistors may include a first transistor TRa, the second transistor TR2, the third transistor TR3, a fourth transistor TRb, the fifth transistor TR5, and the sixth transistor TR6.

However, the input block 111, the shifting block 112, and the output block 113 shown in FIG. 7 may have substantially the same configurations as the input block 111, the shifting block 112, and the output block 113 shown in FIG. 2.

Accordingly, the same reference numerals may be used for components that are the same or substantially the same as the above-described components, and for convenience of explanation, duplicate descriptions of the same components may be omitted.

In addition, in this case, the level shifter 200 may be called a level shifting circuit that outputs the output voltage Vout having a level range different from that of the input voltage Vin.

According to an embodiment, the level shifter 200 may include the first transistor TRa connected between the first node N1 and the power source voltage VDDH.

For example, the level shifter 200 may include the first transistor TRa connected in parallel with the first shifting transistor STR1 between the first node N1 and the power source voltage VDDH.

According to an embodiment, the gate electrode of the first transistor TRa may be connected to the third node N3 between the second transistor TR2 and the third transistor TR3.

In addition, the first voltage V1 in which the input voltage Vin is boosted by charges previously stored in the first capacitor C1 may be transmitted to the third node N3.

Accordingly, the first transistor TRa may be controlled by the first voltage V1 applied from the third node N3 through the gate electrode.

According to an embodiment, when the voltage level of the input voltage Vin transitions from a low level to a high level, the first transistor TRa may be turned on to connect the first node N1 to the power source voltage VDDH.

For example, when the voltage level of the input voltage Vin transitions from a low level to a high level, the high level input voltage Vin may be boosted by the first capacitor C1 and transmitted to the third node N3. Furthermore, the first voltage V1 of the third node N3 may be applied to the gate electrode of the first transistor TRa, so that the first transistor TRa is turned on.

Accordingly, when the voltage level of the input voltage Vin transitions from a low level to a high level, the first node N1 may be connected to the power source voltage VDDH through the first transistor TRa.

In addition, when the voltage level of the input voltage Vin transitions from a low level to a high level, the second transistor TR2 may be turned off so that the first node N1 is disconnected from the first ground voltage Vref1.

For example, when the voltage level of the input voltage Vin transitions from a low level to a high level, the voltage of the first node N1 may be connected to the power source voltage VDDH and the drain voltage may increase, so that the second transistor TR2 is turned off.

Accordingly, when the voltage level of the input voltage Vin transitions from a low level to a high level, the first node N1 may be disconnected from the first ground voltage Vref1 by the second transistor TR2.

That is, when the voltage level of the input voltage Vin transitions from a low level to a high level, the first node N1 may be connected to the power source voltage VDDH by the first transistor TRa, and disconnected from the first ground voltage Vref1 by the second transistor TR2.

Thus, when the voltage level of the input voltage Vin transitions from a low level to a high level, the voltage of the first node N1 may transition from a low level to a high level.

Referring to the above-described configurations, when the voltage level of the input voltage Vin transitions from a low level to a high level, the level shifter 200 may directly connect the first node N1 to the power source voltage VDDH.

Thus, the level shifter 200 may increase the speed at which the first node voltage Vn1 of the first node N1 transitions from a low level to a high level.

In addition, according to an embodiment, the level shifter 200 may include the fourth transistor TRb connected between the second node N2 and the power source voltage VDDH.

For example, the level shifter 200 may include the fourth transistor TRb connected in parallel with the second shifting transistor STR2 between the second node N2 and the power source voltage VDDH.

According to an embodiment, the gate electrode of the fourth transistor TRb may be connected to the fourth node N4 between the fifth transistor TR5 and the sixth transistor TR6.

In addition, the input voltage Vin whose phase is inverted by the first inverter INV1 and which is boosted by the charges previously stored in the second capacitor C2 may be transmitted to the fourth node N4.

Accordingly, the fourth transistor TRb may be controlled by the second voltage V2 applied from the fourth node N4 through the gate electrode.

According to an embodiment, when the voltage level of the input voltage Vin transitions from a high level to a low level, the fourth transistor TRb may be turned on to connect the second node N2 to the power source voltage VDDH.

For example, when the voltage level of the input voltage Vin transitions from a high level to a low level, the high level voltage may be boosted by the second capacitor C2 and transmitted to the fourth node N4. Furthermore, the second voltage V2 of the fourth node N4 is applied to the gate electrode of the fourth transistor TRb, so that the fourth transistor TRb is turned on.

Accordingly, when the voltage level of the input voltage Vin transitions from a high level to a low level, the second node N2 may be connected to the power source voltage VDDH through the fourth transistor TRb.

In addition, when the voltage level of the input voltage Vin transitions from a high level to a low level, the fifth transistor TR5 may be turned off so that the second node N2 is disconnected from the first ground voltage Vref1.

For example, when the voltage level of the input voltage Vin transitions from a high level to a low level, the voltage of the second node N2 may be connected to the power source voltage VDDH and the drain voltage may increase so that the fifth transistor TR5 is turned off.

Accordingly, when the voltage level of the input voltage Vin transitions from a high level to a low level, the second node N2 may be disconnected from the first ground voltage Vref1 by the fifth transistor TR5.

That is, when the voltage level of the input voltage Vin transitions from a high level to a low level, the second node N2 may be connected to the power source voltage VDDH by the fourth transistor TRb and disconnected from the first ground voltage Vref1 by the fifth transistor TR5.

Thus, when the voltage level of the input voltage Vin transitions from a high level to a low level, the voltage of the second node N2 may transition from a low level to a high level.

Referring to the above-described configurations, when the voltage level of the input voltage Vin transitions from a low level to a high level, the level shifter 200 may directly connect the second node N2 to the power source voltage VDDH.

Thus, the level shifter 200 may increase the speed at which the second node voltage Vn2 of the second node N2 transitions from a low level to a high level.

In addition, referring to the above-described configurations, the level shifter 200 according to an embodiment may directly connect the first node N1 and the second node N2 to the power source voltage VDDH through the first transistor TRa and the fourth transistor TRb, respectively.

Thus, the level shifter 200 according to an embodiment of the present disclosure may increase the speed at which the first node voltage Vn1 of the first node N1 and the second node voltage Vn2 of the second node N2 transition to high levels.

Figure 8:
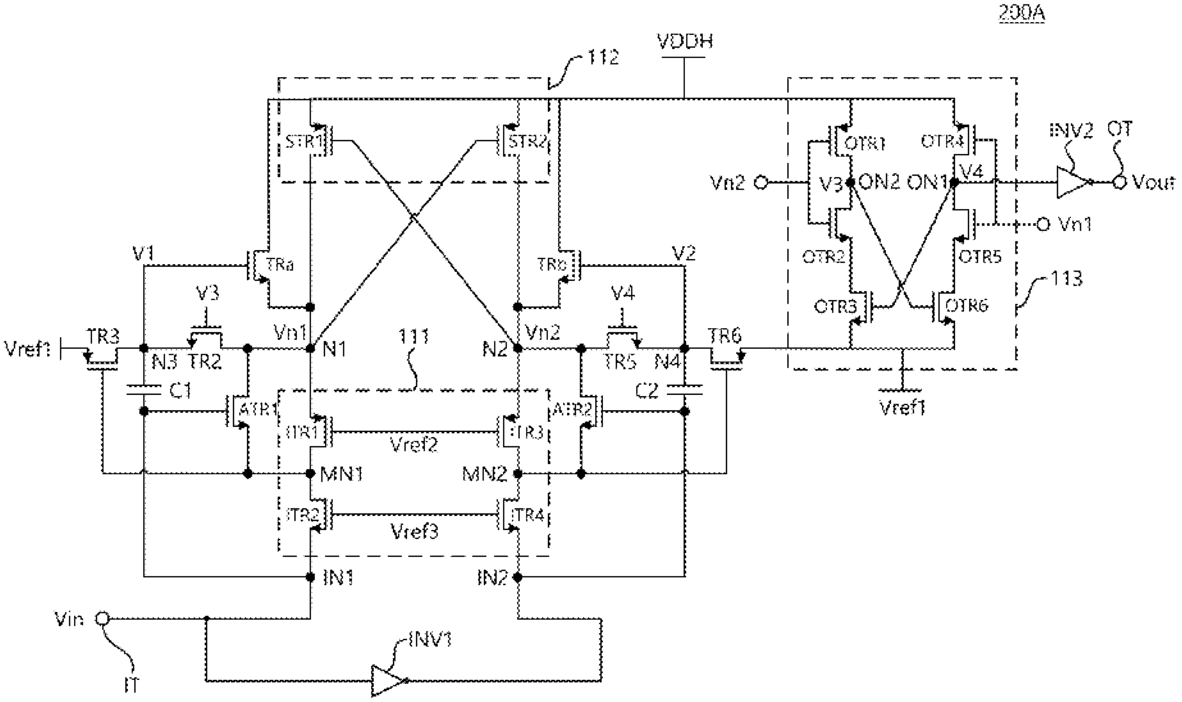
FIG. 8 is a circuit diagram illustrating a level shifter further including a first additional transistor and a second additional transistor according to an embodiment.

FIG. 8 is a circuit diagram illustrating a level shifter further including a first additional transistor and a second additional transistor according to an embodiment.

Referring to FIG. 8, a level shifter 200A according to an embodiment may include the input block 111, the shifting block 112, a plurality of transistors, the first capacitor C1, and the second capacitor C2, the first additional transistor ATR1, and the second additional transistor ATR2.

In this case, the plurality of transistors may include the first transistor TRa, the second transistor TR2, the third transistor TR3, the fourth transistor TRb, the fifth transistor TR5, and the sixth transistor TR6.

In this case, the level shifter 200A shown in FIG. 8 may be understood as an example of the level shifter 200 shown in FIG. 7. Accordingly, the same reference numerals may be used for components that are the same or substantially the same as the above-described components, and for convenience of explanation, duplicate descriptions of the same components may be omitted In addition, in this case, it may be understood that the first additional transistor ATR1 and the second additional transistor ATR2 shown in FIG. 8 are substantially the same as the first additional transistor ATR1 and the second additional transistor ATR2 shown in FIG. 4.

According to an embodiment, the level shifter 200A may include the first additional transistor ATR1 connected between the first node N1 and the first intermediate node MN1.

The level shifter 200A may include the first additional transistor ATR1 connected between the first node N1 and the gate electrode of the third transistor TR3.

That is, the source electrode of the first additional transistor ATR1 may be connected to the first node N1, and the drain electrode may be connected to the first intermediate node MN1 and the gate electrode of the third transistor TR3.

In addition, the gate electrode of the first additional transistor ATR1 may be connected to the input terminal IT to receive the input voltage Vin.

According to an embodiment, in response to the voltage level of the input voltage Vin transitioning from a low level to a high level, the input voltage Vin having a high level may be applied to the gate electrode of the first additional transistor ATR1, so that the first additional transistor ATR1 may be turned on.

For example, in response to the voltage level of the input voltage Vin transitioning from a low level to a high level, the first additional transistor ATR1 may be turned on to apply the first node voltage Vn1 of the first node N1 to the gate electrode of the third transistor TR3.

In response to the first additional transistor ATR1 being turned on as the voltage level of the input voltage Vin transitions from a low level to a high level, the first node voltage Vn1 at a high level may be applied to the gate electrode of the third transistor TR3.

In addition, in response to the first node voltage Vn1 at a high level being applied to the gate electrode of the third transistor TR3, the third transistor TR3 may be turned off.

In addition, the first transistor TRa may be turned on by the first voltage V1. Furthermore, the first node N1 may be connected to the power source voltage VDDH. In addition, the first node voltage Vn1 may transition from a low level to a high level.

Referring to the above-described configurations, when the voltage level of the input voltage Vin transitions from a low level to a high level, the level shifter 200A according to an embodiment may use the first additional transistor ATR1 to transmit the first node voltage Vn1 to the gate electrode of the third transistor TR3.

Accordingly, when the voltage level of the input voltage Vin transitions from a low level to a high level, the level shifter 200A may disconnect the first node N1 and the first ground voltage Vref1 regardless of the size of the first input transistor ITR1.

Thus, when the voltage level of the input voltage Vin transitions from a low level to a high level, the level shifter 200A according to an embodiment of the present disclosure may increase the speed at which the first node voltage Vn1 of the first node N1 transitions from a low level to a high level.

According to an embodiment, the level shifter 200A may include the second additional transistor ATR2 connected between the second node N2 and the second intermediate node MN2.

The level shifter 200A may include the second additional transistor ATR2 connected between the second node N2 and the gate electrode of the sixth transistor TR6.

That is, the source electrode of the second additional transistor ATR2 may be connected to the second node N2, and the drain electrode may be connected to the second intermediate node MN2 and the gate electrode of the sixth transistor TR6.

In addition, the gate electrode of the second additional transistor ATR2 may be connected to the first inverter INV1 to receive the input voltage Vin whose phase is inverted.

According to an embodiment, in response to the voltage level of the input voltage Vin transitioning from a high level to a low level, a high level voltage may be applied to the gate electrode of the second additional transistor ATR2 so that the second additional transistor ATR2 is turned on.

For example, in response to the voltage level of the input voltage Vin transitioning from a high level to a low level, the second additional transistor ATR2 may be turned on to apply the second node voltage Vn2 of the second node N2 to the gate electrode of the sixth transistor TR6.

In response to the second additional transistor ATR2 being turned on as the voltage level of the input voltage Vin transitions from a high level to a low level, the second node voltage Vn2 at a high level may be applied to the gate electrode of the sixth transistor TR6.

In addition, in response to the second node voltage Vn2 at a high level being applied to the gate electrode of the sixth transistor TR6, the sixth transistor TR6 may be turned off.

In addition, the fourth transistor TR4*b* may be turned on by the second voltage V2. Furthermore, the second node N2 may be connected to the power source voltage VDDH. In addition, the second node voltage Vn2 may transition from a low level to a high level.

Referring to the above-described configurations, when the voltage level of the input voltage Vin transitions from a high level to a low level, the level shifter 200A according to an embodiment may use the second additional transistor ATR2 to transmit the second node voltage Vn2 to the gate electrode of the sixth transistor TR6.

Accordingly, when the voltage level of the input voltage Vin transitions from a high level to a low level, the level shifter 200A may disconnect the second node N2 and the first ground voltage Vref1 regardless of the size of the third input transistor ITR3.

Thus, when the voltage level of the input voltage Vin transitions from a high level to a low level, the level shifter 200A according to an embodiment of the present disclosure may increase the speed at which the second node voltage Vn2 of the second node N2 transitions from a low level to a high level.

Referring to the above-described configurations, the level shifter 200A according to an embodiment may transmit the first node voltage Vn1 and the second node voltage Vn2 to the gate electrodes of the third transistor TR3 and the sixth transistor TR6 through the first additional transistor ATR1 and the second additional transistor ATR2, respectively.

Thus, in response to the transition of the voltage level of the input voltage Vin, the level shifter 200A may momentarily turn off the third transistor TR3 and sixth transistor TR6 regardless of the sizes of the first input transistor ITR1 and the third input transistor ITR3.

Accordingly, the level shifter 200A according to an embodiment of the present disclosure may increase the speed at which the first node voltage Vn1 or the second node voltage Vn2 transitions from a low level to a high level.

Figure 9:
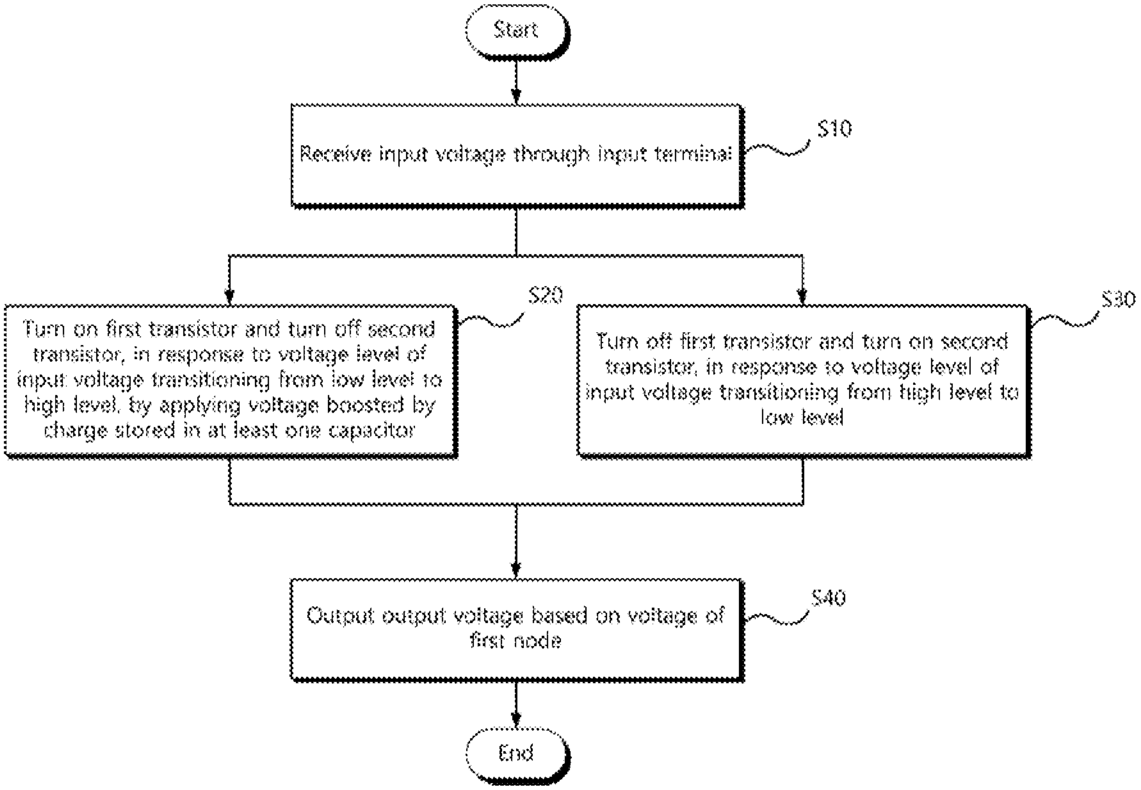
FIG. 9 is a flowchart illustrating a method of controlling a level shifter according to an embodiment.

FIG. 9 is a flowchart illustrating a method of controlling a level shifter according to an embodiment.

Referring to FIG. 9, the level shifter 100 according to an embodiment may output the output voltage Vout in a level range that is different from that of the input voltage Vin.

For example, the level shifter 100 may control the voltage level of the first node voltage Vn1 in response to a transition in the voltage level of the input voltage Vin.

Furthermore, the level shifter 100 may output the output voltage Vout based on the voltage level of the first node voltage Vn1.

In operation S10, the level shifter 100 according to an embodiment may receive the input voltage Vin through the input terminal IT.

For example, the level shifter 100 may receive the input voltage Vin swinging in a specified level range through the input terminal IT.

In operation S20, in response to the voltage level of the input voltage Vin transitioning from a low level to a high level, the level shifter 100 may turn on the first transistor TR1 and turn off the second transistor TR2.

In this case, the first transistor TR1 may be connected between the first node N1 and the power source voltage VDDH. In addition, the second transistor TR2 may be connected between the first node N1 and the first ground voltage Vref1.

For example, in response to the voltage level of the input voltage Vin transitioning from a low level to a high level, the level shifter 100 may turn on the first transistor TR1 connected between the first node N1 and the power source voltage VDDH.

According to an embodiment, the level shifter 100 may use the charges previously stored in the second capacitor C2 connected to the input terminal IT through the first inverter INV1 to transmit the input voltage Vin to the fourth node N4.

Furthermore, the level shifter 100 may apply the second voltage V2 formed at the fourth node N4 to the gate electrode of the first transistor TR1.

That is, in response to the voltage level of the input voltage Vin transitioning from a low level to a high level, the level shifter 100 may apply the second voltage V2, which is formed through the second capacitor C2 by a low-level voltage which is a phase-inverted voltage of the input voltage Vin, to the gate electrode of the first transistor TR1.

Thus, in response to the voltage level transitioning from a low level to a high level, the level shifter 100 may turn on the first transistor TR1 to connect the first node N1 to the power source voltage VDDH.

Accordingly, the level shifter 100 may control the operation of the first transistor TR1 operating in the relatively high level range of the power source voltage VDDH by boosting the relatively low input voltage Vin through the second capacitor C2.

In addition, in response to the voltage level of the input voltage Vin transitioning from a low level to a high level, the level shifter 100 may connect the first node N1 to the power source voltage VDDH.

In addition, in response to the voltage level of the input voltage Vin transitioning from a low level to a high level, the level shifter 100 may turn off the second transistor TR2 connected between the first node N1 and the first ground voltage Vref1.

For example, in response to the voltage level of the input voltage Vin transitioning from a low level to a high level, the level shifter 100 may turn off the second transistor TR2 such that the first node N1 is disconnected from the first ground voltage Vref1.

In addition, in response to the voltage level of the input voltage Vin transitioning from a low level to a high level, the level shifter 100 may turn off the third transistor TR3 connected between the second transistor TR2 and the first ground voltage Vref1 so that the first ground voltage Vref1 and the first node N1 are disconnected.

For example, in response to the voltage level of the input voltage Vin transitioning from a low level to a high level, the level shifter 100 may turn on the first additional transistor ATR1 connected between the first node N1 and the gate electrode of the third transistor TR3.

Thus, the level shifter 100 may apply the first node voltage Vn1 at a high level to the gate electrode of the third transistor TR3.

In this case, as the high-level first node voltage Vn1 is applied to the gate electrode of the third transistor TR3, the third transistor TR3 may be turned off.

Thus, when the voltage level of the input voltage Vin transitions from a low level to a high level, the level shifter 100 may disconnect the first node N1 from the first ground voltage Vref1.

That is, when the voltage level of the input voltage Vin transitions from a low level to a high level, the level shifter 100 may connect the first node N1 to the power source voltage VDDH and disconnect the first node N1 from the first ground voltage Vref1.

Thus, when the voltage level of the input voltage Vin transitions from a low level to a high level, the level shifter 100 may increase the speed at which the voltage level of the first node voltage Vn1 transitions from a low level to a high level.

In operation S30, in response to the voltage level of the input voltage Vin transitioning from a high level to a low level, the level shifter 100 may turn off the first transistor TR1 and turn on the second transistor TR2.

For example, in response to the voltage level of the input voltage Vin transitioning from a high level to a low level, the level shifter 100 may turn off the first transistor TR1 connected between the first node N1 and the power source voltage VDDH.

According to an embodiment, in response to the voltage level of the input voltage Vin transitioning from a high level to a low level, the level shifter 100 may apply the second voltage V2, which is a high-level voltage whose phase is the inverted phase of the input voltage Vin and which is boosted through the second capacitor C2, to the gate electrode of the first transistor TR1.

In this case, it may be understood that the difference between the second voltage V2 and the voltage applied to the source electrode of the first transistor TR1 is lower than the threshold voltage of the first transistor TR1.

Accordingly, the level shifter 100 may turn off the first transistor TR1 to disconnect the first node N1 from the power source voltage VDDH in response to the voltage level transitioning from a high level to a low level.

Thus, in response to the voltage level of the input voltage Vin transitioning from a high level to a low level, the level shifter 100 may disconnect the first node N1 from the power source voltage VDDH.

In addition, in response to the voltage level of the input voltage Vin transitioning from a high level to a low level, the level shifter 100 may turn on the second transistor TR2 connected between the first node N1 and the first ground voltage Vref1.

For example, when the voltage level of the input voltage Vin transitions from a high level to a low level, the level shifter 100 may turn on the second transistor TR2 to connect the first node N1 to the first ground voltage Vref1.

Thus, when the voltage level of the input voltage Vin transitions from a high level to a low level, the level shifter 100 may connect the first node N1 to the first ground voltage Vref1.

That is, when the voltage level of the input voltage Vin transitions from a high level to a low level, the level shifter 100 may disconnect the first node N1 from the power source voltage VDDH and connect the first node N1 to the first ground voltage Vref1.

Thus, when the voltage level of the input voltage Vin transitions from a high level to a low level, the level shifter 100 may increase the speed at which the voltage level of the first node voltage Vn1 transitions from a high level to a low level.

In operation S40, the level shifter 100 according to an embodiment may output the output voltage Vout based on the voltage of the first node N1.

For example, the level shifter 100 may output the output voltage Vout having a level range different from the input voltage Vin based on the first node voltage Vn1 of the first node N1 whose voltage level is controlled by the input voltage Vin.

For example, the level shifter 100 may output the output voltage Vout having a level range of about 0.5 V to about 1.2 V, which is different from the level range of about 0 V to about 0.7 V of the input voltage Vin, based on the first node voltage Vn1.

Referring to the above-described configurations, the level shifter 100 according to an embodiment may increase the speed of controlling the voltage level of the first node N1.

Thus, the level shifter 100 according to embodiments of the present disclosure may reduce the time taken to output the output voltage Vout having a level range different from that of the input voltage Vin.

As described above, the level shifter 100 according to an embodiment of the present disclosure may use the plurality of transistors controlled by the input voltage Vin to directly connect the first node N1 and the second node N2 to voltage sources (e.g., the power source voltage VDDH and the first ground voltage Vref1).

Thus, the level shifter 100 according to embodiments of the present disclosure may reduce the short-circuit current flowing out from the first node N1 and the second node N2 to the input block 111 and/or the shifting block 112.

In addition, the level shifter 100 according to embodiments of the present disclosure may reduce the power consumed to control the first node voltage Vn1 of the first node N1 and the second node voltage Vn2 of the second node N2 based on the voltage level of the input voltage Vin.

In addition, the level shifter 100 according to embodiments of the present disclosure may increase the speed of controlling the voltage levels of the first node voltage Vn1 and the second node voltage Vn2.

In other words, the level shifter 100 according to embodiments of the present disclosure may reduce the time and power consumed to output the output voltage Vout having a level range different from that of the input voltage Vin.

In addition, referring to the above-described configurations, the level shifter 100 may use the control transistors CTR1 and CTR2 to maintain the voltage across both terminals of each of the first transistor TR1 and the fourth transistor TR4 to be less than or about equal to threshold voltages of the control transistors CTR1 and CTR2.

Thus, the level shifter 100 according to an embodiment of the present disclosure may reduce the voltage stress applied to the first transistor TR1 and the second transistor TR2 due to the power source voltage VDDH.

In addition, referring to the above-described configurations, the level shifter 100 may transmit the first node voltage Vn1 and the second node voltage Vn2 to the gate electrodes of the third transistor TR3 and the sixth transistor TR6 through the first additional transistor ATR1 and the second additional transistor ATR2, respectively.

Thus, in response to the transition of the voltage level of the input voltage Vin, the level shifter 100 may momentarily turn off the third transistor TR3 and the sixth transistor TR6 regardless of the sizes of the first input transistor ITR1 and the third input transistor ITR3.

Accordingly, the level shifter 100 according to an embodiment of the present disclosure may increase the speed at which the first node voltage Vn1 or the second node voltage Vn2 transitions from a low level to a high level.

In addition, referring to the above-described configurations, the level shifter 100 may reduce the sizes of the first input transistor ITR1 and the third input transistor ITR3. Thus, the level shifter 100 according to an embodiment of the present disclosure may have a reduced area.

As is traditional in the field of the present disclosure, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions.

As processes become more refined, the level range of an input voltage that transistors included in a level shifter can withstand decreases. Accordingly, when a voltage exceeding the maximum level range of an input voltage that each transistor can withstand is applied, there may be difficulty in ensuring stable operation of the transistors included in the level shifter. Thus, referring to a comparative example, a circuit configuration that distributes the input voltage to several transistors by stacking and connecting a plurality of transistors is used. However, when using a circuit configuration in which a plurality of transistors are stacked and connected, the power consumption of the level shifter may increase and the operating speed may decrease as the plurality of transistors are arranged. Embodiments of the present disclosure, as described above, may provide a level shifter that may decrease power consumption and increase operating speed.

While the present disclosure has been particularly shown and described with reference to embodiments thereof, it will be understood by those of ordinary skill in the art that various changes in form and detail may be made therein without departing from the spirit and scope of the present disclosure as defined by the following claims.

What is claimed is:

1. A level shifter, comprising:

an input block configured to receive an input voltage through an input terminal;

a shifting block connected to the input block through a first node and a second node and connected to a power source voltage;

a first transistor connected between the first node and the shifting block;

a second transistor and a third transistor connected in series between the first node and a first ground voltage; and at least one capacitor connected to the input block, wherein a voltage having an anti-phase to the input voltage is boosted by charges previously stored in the at least one capacitor and applied to a gate electrode of the first transistor, and wherein, when a voltage level of the input voltage transitions from a low level to a high level, the first transistor is turned on by a voltage boosted by the at least one capacitor such that the first node is connected to the power source voltage, and the second transistor is turned off such that the first node is disconnected from the first ground voltage.

2. The level shifter of claim 1, wherein, when the voltage level of the input voltage transitions from the high level to the low level, the first node is disconnected from the power source voltage by turning off the first transistor, and the first node is connected to the first ground voltage by turning on the second transistor.

3. The level shifter of claim 1, further comprising:

a fourth transistor connected between the second node and the shifting block; and a fifth transistor and a sixth transistor connected in series between the second node and the first ground voltage, wherein the at least one capacitor includes a first capacitor connected between the input voltage and a third node between the second transistor and the third transistor, and a second capacitor connected between the input block and a fourth node between the fifth transistor and the sixth transistor, and wherein a first voltage of the third node, in which the input voltage is boosted by charges previously stored in the first capacitor, is applied to a gate electrode of the fourth transistor, and a second voltage of the fourth node, in which a voltage anti-phased to the input voltage is boosted by charges previously stored in the second capacitor, is applied to the gate electrode of the first transistor.

4. The level shifter of claim 3, wherein, when the voltage level of the input voltage transitions from the low level to the high level, the second node is disconnected from the power source voltage by turning off the fourth transistor, and the second node is connected to the first ground voltage by turning on the fifth transistor.

5. The level shifter of claim 3, wherein the input block includes a first input transistor and a second input transistor connected in series between the input terminal and the first node, and a third input transistor and a fourth input transistor connected in series between the input terminal and the second node, and wherein each gate electrode of the first input transistor and the third input transistor is connected to a second ground voltage that is lower than the first ground voltage.

6. The level shifter of claim 5, wherein a gate electrode of the third transistor is connected to a first intermediate node between the first input transistor and the second input transistor, and a gate electrode of the sixth transistor is connected to a second intermediate node between the third input transistor and the fourth input transistor.

7. The level shifter of claim 3, wherein the shifting block further includes a first shifting transistor connected between the first transistor and the power source voltage and including a gate electrode connected to the second node, and a second shifting transistor connected between the fourth transistor and the power source voltage and including a gate electrode connected to the first node.

8. The level shifter of claim 3, wherein, when the voltage level of the input voltage transitions from the low level to the high level, the first ground voltage is disconnected from the first node and the input block by turning off the third transistor, and the first ground voltage is connected to the second node and the input block by turning on the sixth transistor.

9. The level shifter of claim 3, further comprising:

a first control transistor including a gate electrode and a drain electrode connected to each other, and connected in parallel with the first transistor; and a second control transistor including a gate electrode and a drain electrode connected to each other, and connected in parallel with the fourth transistor, wherein a voltage difference between a source electrode and a drain electrode of the first transistor is maintained to be less than or about equal to a threshold voltage of the first control transistor, and a voltage difference between a source electrode and a drain electrode of the fourth transistor is maintained to be less than or about equal to a threshold voltage of the second control transistor.

10. The level shifter of claim 3, further comprising:

a first additional transistor connected between the first node and a gate electrode of the third transistor and including a gate electrode connected to the input terminal, wherein the first additional transistor is turned on and applies a voltage of the first node to the gate electrode of the third transistor in response to the voltage level of the input voltage transitioning from the low level to the high level.

11. The level shifter of claim 10, further comprising:

a second additional transistor connected between the second node and a gate electrode of the sixth transistor and including a gate electrode connected to the second capacitor, wherein the second additional transistor is turned on and applies the voltage of the first node to the gate electrode of the third transistor in response to the voltage level of the input voltage transitioning from the low level to the high level.

12. The level shifter of claim 1, further comprising:

an output block connected to an output terminal, wherein the output block includes a plurality of transistors and, based on voltages of the first node and the second node, outputs an output voltage having a level range different from a level range of the input voltage through the output terminal.

13. A method of controlling a level shifter, the method comprising:

receiving an input voltage through an input terminal;

turning on a first transistor connected between a first node and a power source voltage and turning off a second transistor between the first node and a first ground voltage in response to a voltage level of the input voltage transitioning from a low level to a high level;

turning off the first transistor and turning on the second transistor in response to the voltage level of the input voltage transitioning from the high level to the low level; and outputting an output voltage having a level range different from a level range of the input voltage based on a voltage of the first node, wherein turning on the first transistor includes applying a voltage having an anti-phase to the input voltage boosted by charges previously stored in at least one capacitor to a gate electrode of the first transistor.

14. The method of claim 13, further comprising:

disconnecting the first ground voltage from the first node by turning off a third transistor connected between the second transistor and the first ground voltage in response to the voltage level of the input voltage transitioning from the low level to the high level.

15. The method of claim 14, further comprising:

applying the voltage of the first node to the gate electrode of the third transistor by turning on a first additional transistor connected between the first node and a gate electrode of the third transistor in response to the voltage level of the input voltage transitioning from the low level to the high level.

16. A level shifting circuit, comprising:

an input block configured to receive an input voltage through an input terminal;

a shifting block connected to the input block through a first node and a second node, and including a first shifting transistor connected between the first node and a power source voltage and a second shifting transistor connected between the second node and the power source voltage;

a first transistor connected in parallel with the first shifting transistor between the first node and the power source voltage;

a second transistor and a third transistor connected in series between the first node and a first ground voltage; and at least one capacitor connected to the input block, wherein a voltage having an anti-phase to the input voltage is boosted by charges previously stored in the at least one capacitor and applied to a gate electrode of the first transistor, and wherein, when a voltage level of the input voltage transitions from a low level to a high level, the first node is connected to the power source voltage by turning on the first transistor, and the first node is disconnected from the first ground voltage by turning off the second transistor.

17. The level shifting circuit of claim 16, wherein, when the voltage level of the input voltage transitions from the high level to the low level, the first node is disconnected from the power source voltage by turning off the first transistor, and the first node is connected to the first ground voltage by turning on the second transistor.

18. The level shifting circuit of claim 16, further comprising:

a fourth transistor connected in parallel with the second shifting transistor between the second node and the power source voltage; and a fifth transistor and a sixth transistor connected in series between the second node and the first ground voltage, wherein the at least one capacitor includes a first capacitor connected between the input voltage and a third node between the second transistor and the third transistor, and a second capacitor connected between the input block and a fourth node between the fifth transistor and the sixth transistor, wherein a first voltage of the third node, in which the input voltage is boosted by charges previously stored in the first capacitor, is applied to a gate electrode of the fourth transistor, and a second voltage of the fourth node, in which a voltage anti-phased to the input voltage is boosted by charges previously stored in the second capacitor, is applied to the gate electrode of the first transistor.

19. The level shifting circuit of claim 18, wherein, when the voltage level of the input voltage transitions from the low level to the high level, the third node is disconnected from the power source voltage by turning off the fourth transistor, and the third node is connected to the first ground voltage by turning on the fifth transistor.

20. The level shifting circuit of claim 16, further comprising:

a first additional transistor connected between the first node and a gate electrode of the third transistor and including a gate electrode connected to the input terminal, wherein the first additional transistor is turned on and applies a voltage of the first node to the gate electrode of the third transistor in response to the voltage level of the input voltage transitioning from the low level to the high level.

* * * * *